(12) United States Patent
Dong et al.

(10) Patent No.: US 8,913,432 B2
(45) Date of Patent: Dec. 16, 2014

(54) PROGRAMMING SELECT GATE TRANSISTORS AND MEMORY CELLS USING DYNAMIC VERIFY LEVEL

(71) Applicant: SanDisk Technologies Inc., Plano, TX (US)

(72) Inventors: Yingda Dong, San Jose, CA (US); Cynthia Hsu, San Jose, CA (US); Masaaki Higashitani, Cupertino, CA (US); Ken Oowada, Fujisawa (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/285,878

(22) Filed: May 23, 2014

(65) Prior Publication Data

US 2014/0254283 A1    Sep. 11, 2014

Related U.S. Application Data

(63) Continuation of application No. 13/759,303, filed on Feb. 5, 2013.

(51) Int. Cl.
*G11C 16/04* (2006.01)
*G11C 16/34* (2006.01)

(52) U.S. Cl.
CPC ........ *G11C 16/3459* (2013.01); *G11C 16/3427* (2013.01); *G11C 16/3454* (2013.01); *G11C 16/0425* (2013.01)
USPC ............ 365/185.14; 365/185.28; 365/185.17; 365/185.21

(58) Field of Classification Search
CPC ............ H01L 27/115; H01L 29/42328; G11C 16/0425; G11C 16/10
USPC .............. 365/185.14, 185.28, 185.17, 185.21
See application file for complete search history.

(56) References Cited

U.S. PATENT DOCUMENTS

| | | | |
|---|---|---|---|
| 6,944,068 B2 | 9/2005 | Quader et al. | |
| 7,243,275 B2 | 7/2007 | Gongwer et al. | |
| 7,489,543 B1 | 2/2009 | Lee | |
| 7,492,634 B2 | 2/2009 | Li et al. | |
| 7,561,474 B2 | 7/2009 | Kim et al. | |

(Continued)

OTHER PUBLICATIONS

International Search Report & The Written Opinion of the International Searching Authority dated May 15, 2014, International Application No. PCT/US2014/013698.

(Continued)

*Primary Examiner* — Jason Lappas
(74) *Attorney, Agent, or Firm* — Vierra Magen Marcus LLP

(57) ABSTRACT

Programming accuracy is increased for select gate transistors and memory cells by using a dynamic verify voltage which increases from an initial level to a final level during a programming operation. Faster-programming transistors are locked out from programming before slower-programming transistors, but experience program disturb which increases their threshold voltage to a common level with the slower-programming transistors at the conclusion of the programming operation. For programming of memory cells to different target data states, an offset between the initial and final verify levels can be different for each data state. In one approach, the offset is greater for lower target data states. The increases in the dynamic verify voltage can be progressively smaller with each subsequent program-verify iteration of the programming operation. The start of the increase can be adapted to the programming progress or can be at a predetermined program-verify iteration.

30 Claims, 19 Drawing Sheets

(56) References Cited

U.S. PATENT DOCUMENTS

| | | |
|---|---|---|
| 7,706,190 B2 | 4/2010 | Yang et al. |
| 7,800,956 B2 | 9/2010 | Lee et al. |
| 7,859,922 B2 | 12/2010 | Aritome |
| 8,174,895 B2 | 5/2012 | Chen et al. |
| 8,223,555 B2 | 7/2012 | Kim et al. |
| 2004/0109362 A1 | 6/2004 | Gongwer et al. |
| 2006/0034124 A1* | 2/2006 | Guterman et al. ....... 365/185.21 |
| 2008/0316820 A1 | 12/2008 | Seol et al. |
| 2009/0034339 A1 | 2/2009 | Eguchi et al. |
| 2010/0135082 A1 | 6/2010 | Bathul et al. |
| 2012/0081963 A1 | 4/2012 | Dutta et al. |
| 2012/0275233 A1 | 11/2012 | Sarin et al. |

OTHER PUBLICATIONS

Park, et al., "Direct Field Effect of Neighboring Cell Transistor on Cell-to-Cell Interference of NAND Flash Cell Arrays," IEEE Electron Device Letters, vol. 30, No. 2, Feb. 2009, 4 pages.
U.S. Appl. No. 13/660,203, filed Oct. 25, 2012.
U.S. Appl. No. 13/759,303, filed Feb. 5, 2013.
Notice of Allowance dated Sep. 16, 2014, U.S. Appl. No. 13/759,303, filed Feb. 5, 2013.

* cited by examiner

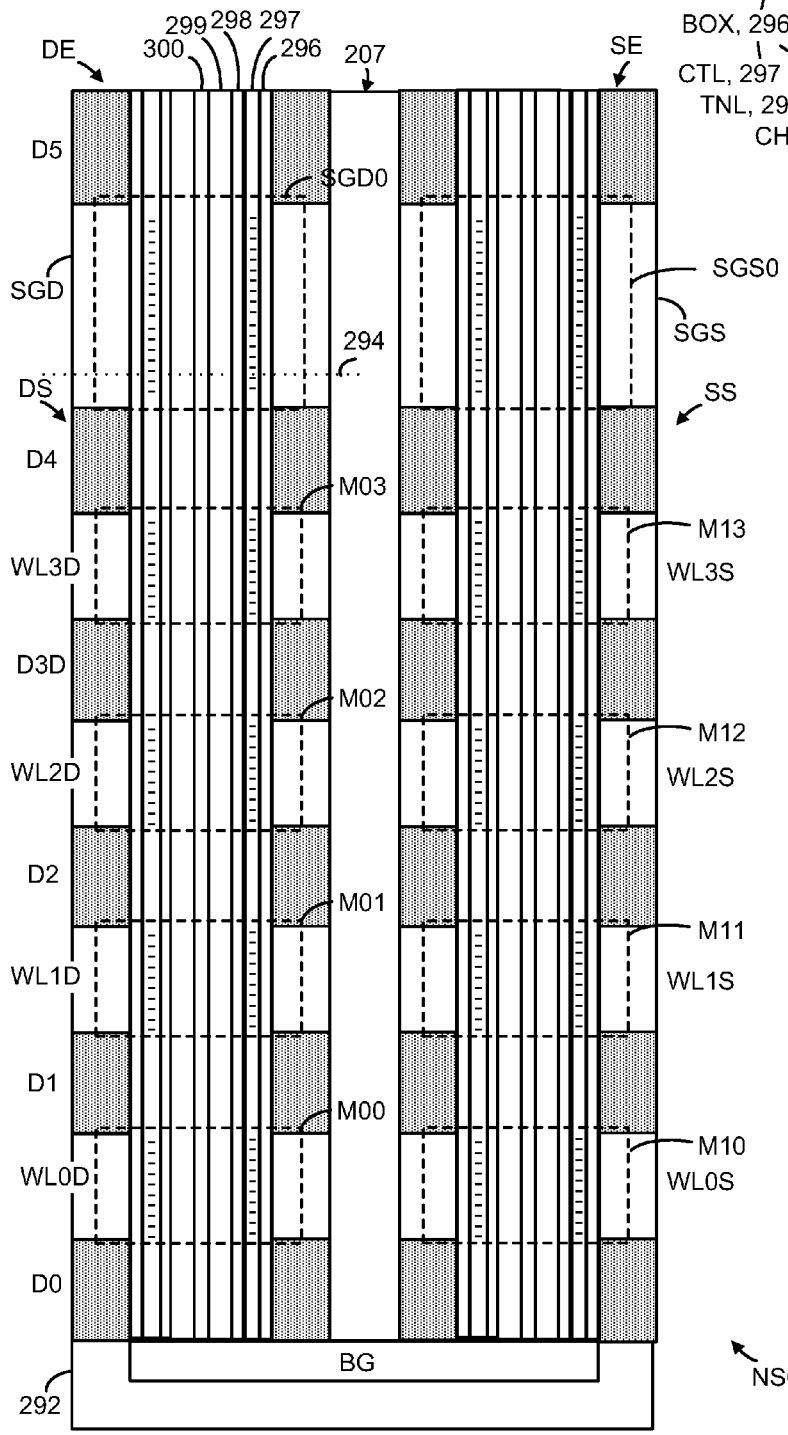

Fig. 10A
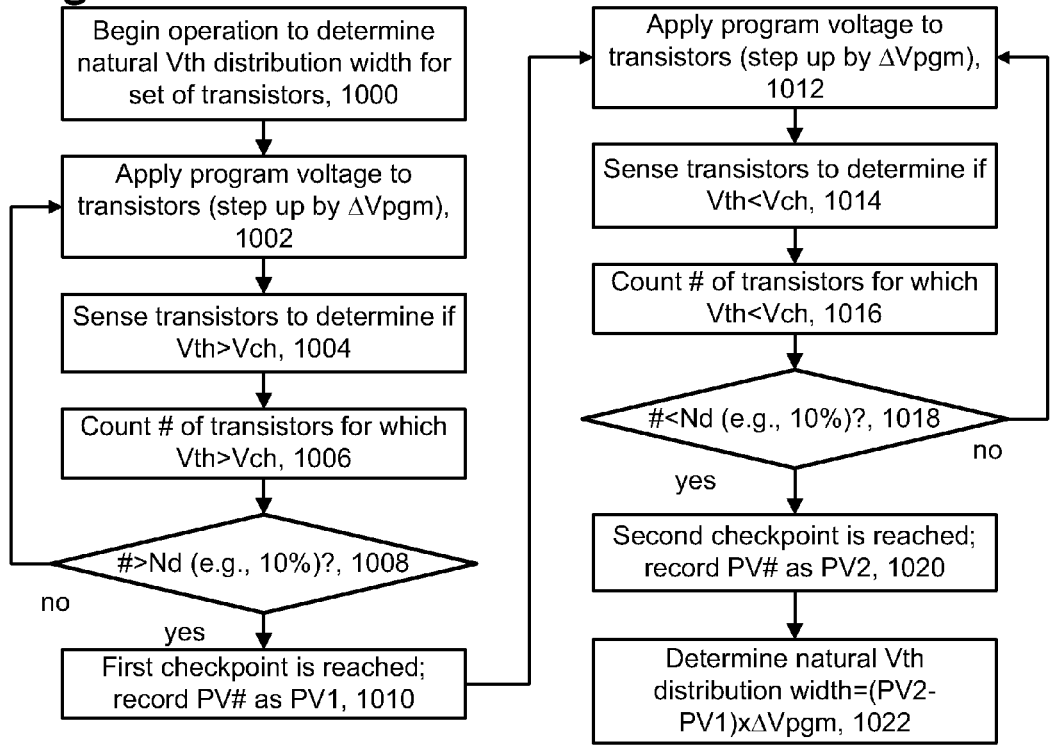
Determining natural Vth distribution width
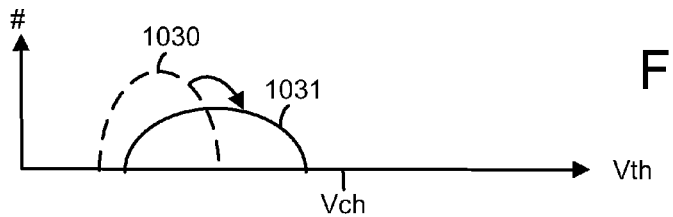
Fig. 10B
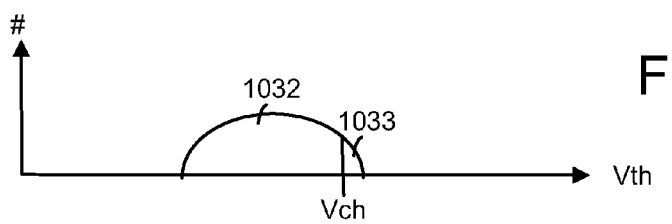
Fig. 10C
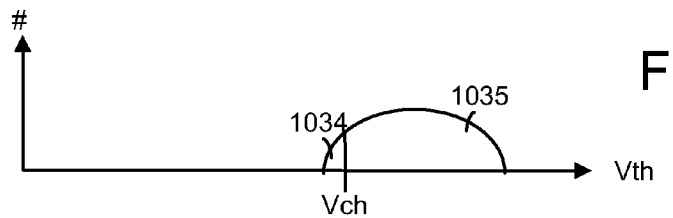
Fig. 10D

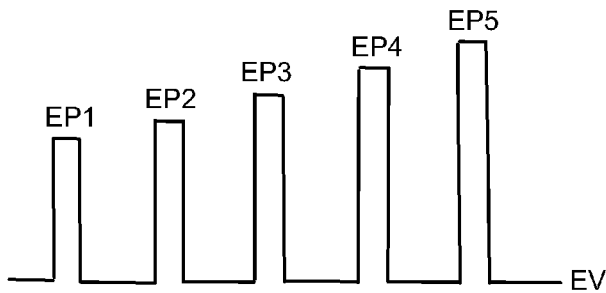
Fig. 16A
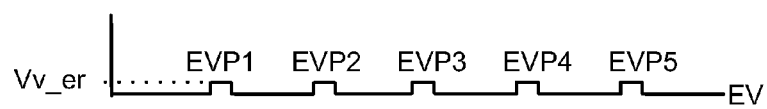
Fig. 16B
Fig. 16C
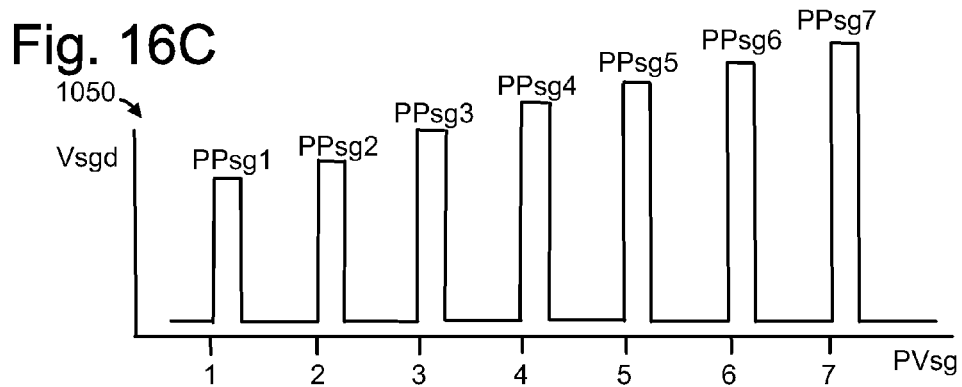
Fig. 16D
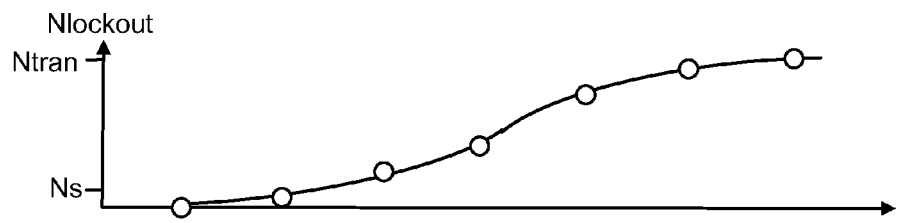
Fig. 16E
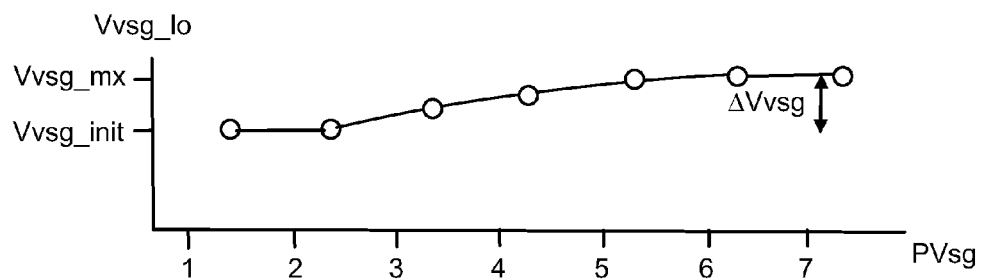

PROGRAMMING SELECT GATE TRANSISTORS AND MEMORY CELLS USING DYNAMIC VERIFY LEVEL

CLAIM OF PRIORITY

This application is a continuation application of U.S. patent application Ser. No. 13/759,303, entitled "Programming Select Gate Transistors And Memory Cells Using Dynamic Verify Level," filed Feb. 5, 2013, published as U.S. patent application Ser. No. 2014/0219027 on Aug. 7, 2014, and incorporated herein by reference in its entirety.

BACKGROUND

1. Field

The present technology relates to techniques for programming transistors in a non-volatile memory device.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Flash memory is among the most popular type of non-volatile semiconductor memories. With flash memory, the contents of an entire memory array can be erased in one step.

For example, 2D NAND memory device is one type of flash memory in which a floating gate is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Recently, ultra high density storage devices have been proposed using a 3D NAND stacked memory structure. One example is the Bit Cost Scalable (BiCS) architecture in which the memory device is formed from an array of alternating conductive and dielectric layers. A memory hole is drilled in the layers to define many memory layers simultaneously. A NAND string is then formed by filling the memory hole with appropriate materials. /A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

Techniques are desired for accurately programming the threshold voltage ranges, in particular, as memory devices are scaled down.

BRIEF DESCRIPTION OF THE DRAWINGS

Like-numbered elements refer to common components in the different figures.

FIG. 3B depicts a cross-sectional view of a NAND string of FIG. 2A in an example 3D memory device.

FIG. 3C depicts a cross-sectional view of the NAND string of FIG. 3B along line 294.

FIG. 10A depicts a flowchart of a process to determine a natural Vth distribution width for a set of transistors in accordance with step 922 of FIG. 9B.

FIGS. 10B to 10D depict a change in a threshold voltage distribution of a set of transistors during the process for determining a natural Vth distribution width of FIG. 10A.

FIG. 16A depicts erase voltages used in the erasing process of FIG. 15B.

FIG. 16B depicts verify voltages used in the erasing process of FIG. 15B.

FIG. 16C depicts program voltages used in a programming operation for SG transistors in accordance with step 1508 of FIG. 15A.

FIG. 16D depicts a number of SG transistors which have a lockout status as a function of program-verify iteration in the programming operation of FIG. 16C.

FIG. 16E depicts dynamic verify voltages used in the programming operation of FIG. 16C.

DETAILED DESCRIPTION

Figure 1:
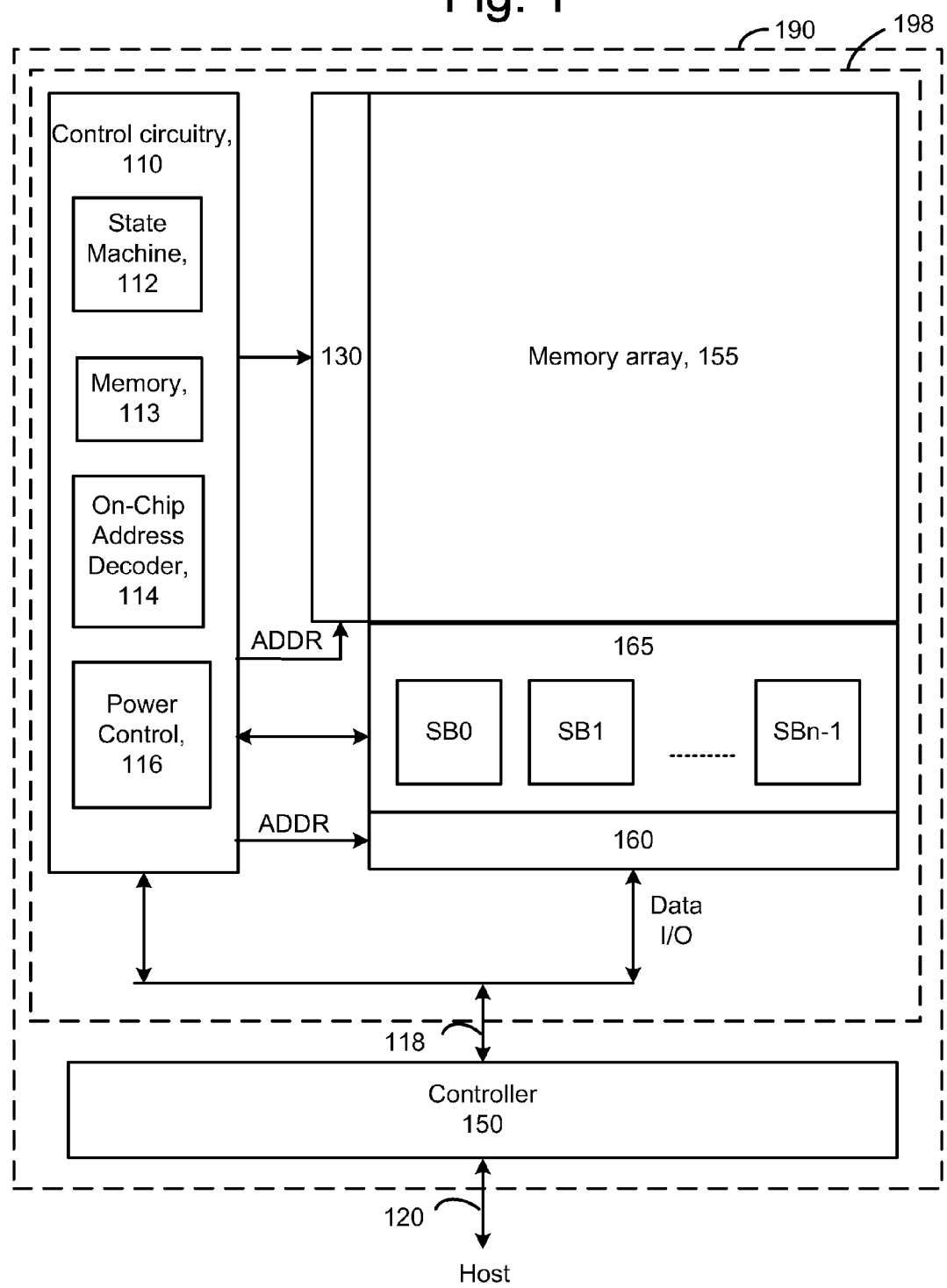
FIG. 1 is a functional block diagram of a non-volatile memory device.

A technique is provided for programming select gate transistors and memory cell transistors with increased accuracy in a non-volatile memory device.

A NAND string typically includes select gate (SG) transistors at each end. For example, a drain-side select gate (SGD) transistor is at a drain end of the NAND string and a source-side select gate (SGS) transistor is at an opposite source end of the NAND string. The SG transistors have a threshold voltage (Vth) which has to be within a specified range for the memory device to operate properly. Occasionally, it is desirable to evaluate and adjust the Vth when the SG transistors are of a type which have the ability to store charge and therefore have their Vth adjusted. For example, some SG transistors have a charge-trapping layer, such as in a 3D NAND memory device or a 2D flat cell NAND memory device. These are examples of charge-trapping SG transistors. The Vth can be adjusted by erasing and then programming the SG transistors.

However, during programming, it is difficult to fully inhibit programming of a SG transistor which has reached a desired Vth level, due to the maximum bit line voltage (Vbl) which is available. During programming, program pulses are applied which case the SG transistors to transition from a program status to a lockout status where they are inhibited from further programming by setting Vbl to a power supply level (Vdd) (lockout level) of the memory device, such as 2-3 V. However, program voltages which are above this level, e.g., 10 V or more, continue to be applied to the set of SG transistors to continue programming of the remaining SG transistors. As a result, all of the SG transistors are in a conductive state, so that the channel region for the locked out SG transistors cannot be boosted. Since the ability to inhibit further programming of the locked out SG transistors is limited, they continue to be weakly programmed and their Vth can continue to increase past the desired Vth level. This is a type of program disturb which widens the Vth distribution of the set of SG transistors by providing an upper tail to the Vth distribution.

An analogous situation occurs during programming of memory cells, such as for 2D NAND. The Vth of a memory cell which has reached a desired Vth can continue to increase in the remainder of a programming operation due to capacitive coupling from the floating gate of a bit line neighbor cell whose Vth continues to increase during programming. This is also a type of program disturb. The memory cells which lockout sooner will experience more capacitive coupling and therefore a higher Vth upshift between the time they are locked out and the time the programming operation is complete. The memory cells which lockout later will experience less capacitive coupling and therefore a smaller Vth upshift.

Techniques provided herein allow more accurate programming of charge-storing transistors such as SG transistors and memory cells by using a dynamic verify level. The dynamic verify level is a verify level which changes during a programming operation, such as by gradually increasing from an initial level to a final level. The change in the verify level allows faster-programming transistors, which are subject to the most program disturb, to lockout at a lower Vth than slower-programming transistors. The program disturb experienced by the faster-programming transistors brings their Vth to a common level with the slower-programming transistors at the completion of the programming operation.

By optimizing the initial level and the increases in the verify level, a narrower Vth distribution can be realized. The verify level which increases is a lockout verify level, e.g., a verify level used to determine whether to lockout a transistor from further programming. The techniques are compatible with slow and fast programming modes, in which case the lockout verify level is the verify level of the slow programming mode and a verify level which is offset below the lockout verify level, e.g., by a fixed voltage, is the verify level of the fast programming mode. Moreover, programming time is not reduced, in contrast to other approaches which tighten the Vth distribution such as by using a small program pulse step size.

Example memory devices in which the programming techniques can be used are discussed next.

FIG. 1 is a functional block diagram of a non-volatile memory device. FIG. 1 is a block diagram of a non-volatile memory system using single row/column decoders and read/write circuits. A memory device 190 has read/write circuits for reading and programming a page of memory cells (e.g., non-volatile storage elements) in parallel, according to one embodiment. A memory die 198 includes a two-dimensional (2D) memory array 155 of memory cells, control circuitry 110, and read/write circuits 165.

In some embodiments, the array of memory cells can be three-dimensional (3D). The memory array 155 is addressable by word lines via a row decoder 130 and by bit lines via a column decoder 160. The read/write circuits 165 include multiple sense blocks SB0, SB1 . . . SBn−1 and allow a page of memory cells to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114 and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control module 116, sense blocks SB0, SB1 . . . SBn–1 (including the processor 192 and managing circuit MC0 in FIG. 3), read/write circuits 165, and controller 150, and so forth. The sense block SB0 is discussed further in connection with FIG. 3A.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

The diagram can apply to different types of memory including 2D and 3D NAND memory devices.

Figure 2A:
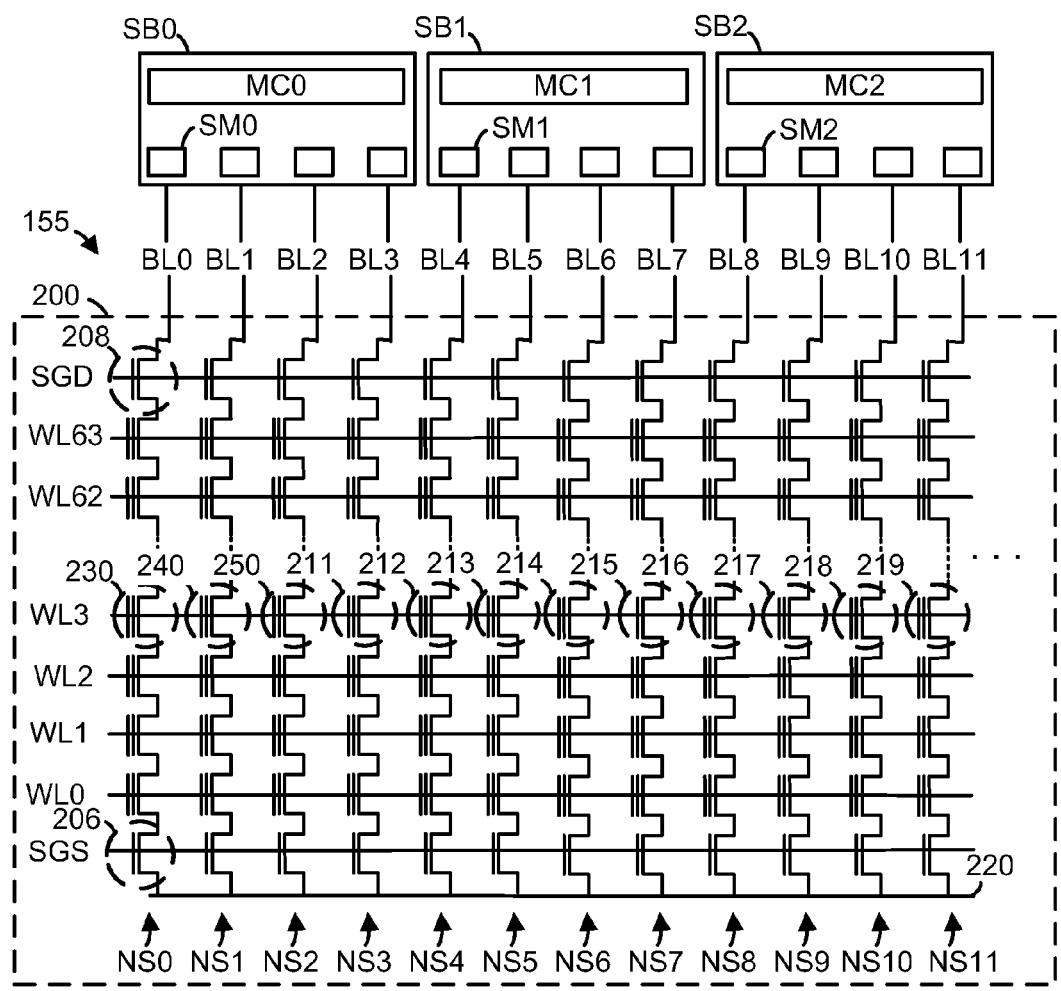
FIG. 2A depicts a block of NAND strings in the memory array 155 of FIG. 1 and associated sense blocks.

FIG. 2A depicts a block of NAND strings in the memory array 155 of FIG. 1 and associated sense blocks SB0 to SB2. The memory array can include many blocks. An example block 200 includes a number of NAND strings NS0 to NS11 and respective bit lines, e.g., BL0 to BL11, which are shared among the blocks. Each NAND string is connected at one end to a drain select gate (SGD) transistor, and the control gates of the SGD transistors are connected via a common SGD line. Each NAND string is connected at its other end to a source select gate (SGS) transistor which, in turn, is connected to a common source line 220. For example, NS0 includes a SGS transistor 206 and a SGD transistor 208. Example memory cells 230, 240 and 250 are in NS0 to NS2, respectively, and are connected to WL3. As an example, memory cells 230 and 250 are bit line adjacent memory cells of memory cell 240. Other example memory cells along WL3 are 211 to 219 which are in N3 to NS11, respectively. For example, WL3 could be a selected word line which is selected for programming and the example memory cells can be selected memory cells which are selected for programming. Other memory cells connected to WL3 can also be selected memory cells. Sixty-four word lines, for example, WL0-WL63, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3A.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge memory cells in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
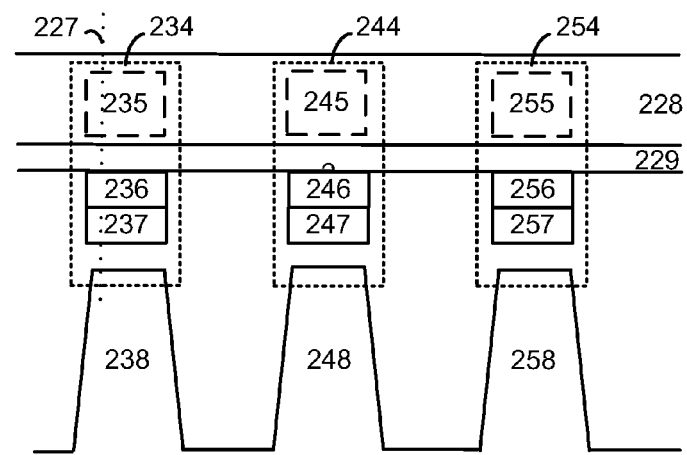
FIG. 2B depicts a cross-sectional view of the NAND strings of FIG. 2A in a 2D memory device embodiment comprising a flat control gate.

FIG. 2B depicts a cross-sectional view of the NAND strings of FIG. 2A in a 2D memory device embodiment comprising a flat control gate. A bit line or NAND string direction goes into the page, and a word line direction goes from left to right. As an example, a word line 228 such as WL3 extends across NAND strings NS0, NS1 and NS2 which include respective channel regions 238, 248 and 258. An IPD layer 229 is depicted. The memory cells 234 in NS0 includes a control gate 235, a charge-trapping layer 236, a polysilicon layer 237 and the channel region 238. The memory cells 244 in NS1 includes a control gate 245, a charge-trapping layer 246, a polysilicon layer 247 and the channel region 248. The memory cells 254 in NS2 includes a control gate 255, a charge-trapping layer 256, a polysilicon layer 257 and the channel region 258. The control gates are portions of the word line. A cross-sectional view along line 227 is provided in FIG. 2C.

Figure 2C:
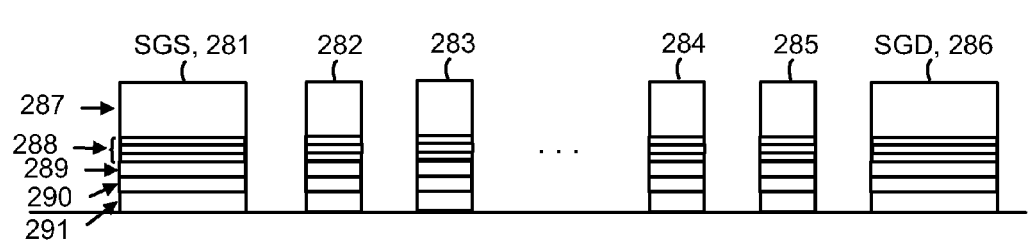
FIG. 2C depicts a cross sectional view along line 227 in FIG. 2B, showing a NAND string of the embodiment having a flat control gate.

FIG. 2C depicts a cross sectional view along line 227 in FIG. 2B, showing a NAND string of the embodiment having a flat control gate. The NAND string 280 can represent NS0 in FIG. 2A, for instance. It includes an SGS transistor 281, example memory cells 282, 283, . . . , 284 and 285 and an SGD transistor 286. A control gate layer 287, IPD layer 288, charge trap layer 289, polysilicon layer 290 and tunnel oxide layer 291 may be present in each of the select gate transistors and memory cells. The control gate layer may be polysilicon and the tunnel oxide layer may be silicon oxide, for instance. The IPD layer can be a stack of high-k dielectrics such as AlOx or HfOx which help increase the coupling ratio between the control gate layer and the charge-trapping or charge storing layer. The charge trap layer can be a mix of silicon nitride and oxide, for instance. A difference between the floating gate memory cell and the flat memory cell is the height of the charge storage layer. A typically floating gate height may be about 100 nm, while a charge trap layer can be as small as 3 nm, and the polysilicon layer can be about 5 nm.

Figure 3A:
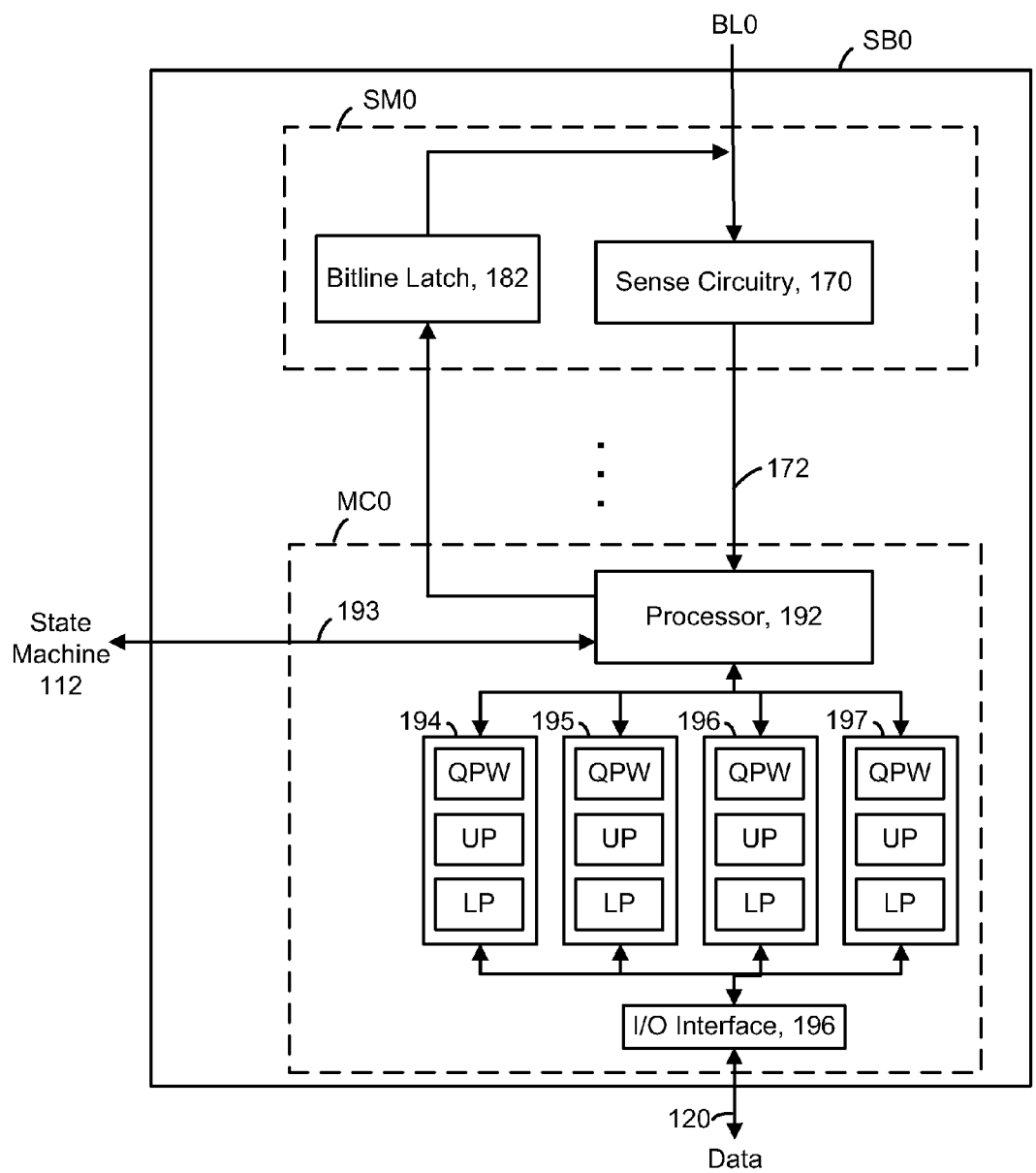
FIG. 3A is a block diagram depicting one embodiment of the sense block SB0 of FIG. 1.

FIG. 3A is a block diagram depicting one embodiment of the sense block SB0 of FIG. 1. The individual sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of memory cells.

The sense module SM0 comprises sense circuitry 170 that performs sensing by determining whether a conduction current in a connected bit line is above or below a predetermined threshold level. SM0 includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming (status=lockout), while flag=1 allows programming (status=program).

Managing circuit MC0 comprises a processor 192, four example sets of data latches 194-197 and an I/O Interface 196 coupled between the sets of data latches and a data bus 120. One set of data latches can be provide for each sense module, and data latches identified by LP, UP and QPW1 may be provided for each set. In some cases, additional data latches may be used. In other cases, fewer data latches may be used. LP stores a bit for a lower page of data, and UP stores a bit for an upper page of data. This is in a four-level or two-bits per memory cells memory device. In each set of latches, one or more additional data latches, each storing one bit of data, can be provided to maintain a count of program pulses which are applied to a memory cell when its Vth is between the lower and higher verify levels, e.g., when the memory cell experiences slow programming.

Processor 192 performs computations, such as to determine the data stored in the sensed memory cells and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed memory cells. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine reads the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120. The programming operation, under the control of the state machine, comprises a series of program voltage pulses applied to the control gates of the addressed memory cell. Each program pulse is followed by a read back (verify) to determine if the memory cell has been programmed to the desired memory state. In some cases, processor 192 monitors the read back memory state relative to the desired memory state. When the two states agree, the processor 192 sets the bit line latch 182 to cause the bit line to be pulled to a state designating program inhibit. This inhibits the memory cell coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6A:
FIGS. 6A to 6D depict a three-pass programming operation in which lower, middle and upper pages of data are written in first, second and third passes, respectively.
Figure 6B:
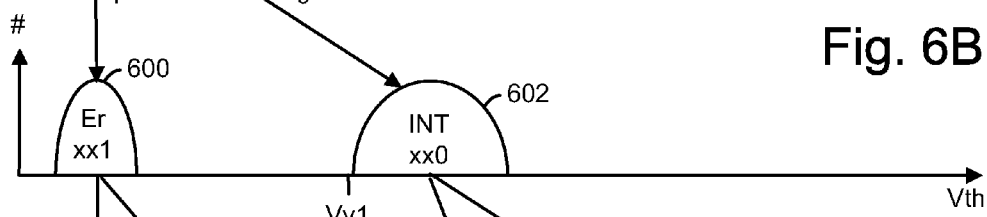
Figure 6C:
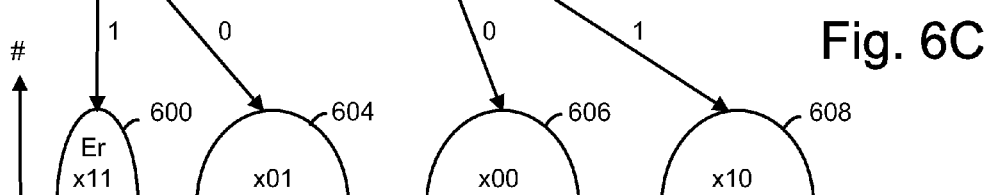

The data latches identify when an associated memory cell has reached certain mileposts in a programming operation. For example, latches may identify that the Vth of a memory cell is below a particular verify level. The data latches indicate whether a memory cell currently stores one or more bits from a page of data. When lower and upper page bits are used (e.g., in case of two-bits per memory cell), the LP latches can be used to store a lower page of data and are flipped (e.g., from 0 to 1) when a lower page bit is stored in an associated memory cell. The UP latches can be used to store an upper page of data and are flipped when an upper page bit is stored in an associated memory cell. The flipping of a bit occurs when an associated memory cell completes programming, e.g., when its Vth exceeds a target or lockout verify level, Vv_lo. When lower, middle and upper page bits are used (e.g., in case of three-bits per memory cell), MP (middle page) latches are also used. MP is flipped when a middle page bit is stored in an associated memory cell. For example, in FIG. 6B to 6D, the first bit (from right to left) is the lower page bit, the second bit is the middle page bit and the third bit is the upper page bit.

FIG. 3B depicts a cross-sectional view of a NAND string of FIG. 2A in an example 3D memory device. A stacked 3D non-volatile memory device includes alternating conductive and insulating layers in which select gates and memory cells are formed. The conductive layers are WL0D, WL3D and SGS on the drain side and WL0S, WL3S and SGD on the source side, and the insulating layers are D0 to D5. A block of such a memory device is typically divided into multiple subblocks for erase and programming operations, where all the sub-blocks share same word line (WL), bit line (BL) and source line (SL) biases, but have separate select gate (SGS and SGD) biases. Further, a NAND string can be straight or, as depicted, U-shaped. As an example, the NAND string NS0 can represent one of the NAND strings of FIG. 2A.

The NAND string has a drain side (DS) and a source side (SS) separated by an insulation-filled slit 207 and connected by a back gate (BG) which can be a conductive film in an insulating layer 292. A drain end (DE) of the NAND string is in communication with a bit line, and a source end (SE) of the NAND string is in communication with a source line.

Each side of the NAND string has a column which includes a number of layers which are deposited along the sidewalls of the column. These layers can include oxide-nitride-oxide and polysilicon layers which are deposited, e.g., using atomic layer deposition. For example, a block oxide (BOX) can be deposited as layer 296, a nitride such as SiN as a charge-trapping layer (CTL) can be deposited as layer 297, a tunnel oxide (TNL) can be deposited as layer 298, a polysilicon body or channel (CH) can be deposited as layer 299, and a core filler dielectric can be deposited as region 300.

Select gates SGD0 and SGS0 are formed in the SGD and SGS layers, respectively. Memory cells M00 and M10 are formed in WL0D and WL0S, respectively, memory cells M01 and M11 are formed in WL1D and WL1S, respectively, memory cells M02 and M12 are formed in WL2D and WL2S, respectively, and memory cells M03 and M13 are formed in WL3D and WL3S, respectively.

When a memory cell is programmed, electrons are stored in a portion of the CTL which is associated with the memory cell. For example, electrons are represented by "−" symbols in the CTL 297. These electrons are drawn into the CTL from the channel, and through the TNL. The threshold voltage of a memory cell is increased in proportion to the amount of stored charge. A select gate transistor can be programmed similarly.

During an erase operation, a voltage in the channel of the NAND string is raised due to gate-induced drain leakage (GIDL) at the drain side of the SGD transistor. The voltage of the memory cell layers is then driven down to a reduced level such as 0 V to create an electric field across the TNL which causes holes to be injected from the memory cell's body to the CTL, resulting in a large Vth downshift toward an erase-verify level, Vv_er. This process can be repeated in successive erase-verify iterations. Unselected word lines remain at an elevated level so that the electric field across the TNL is relatively small, and no, or very little, hole tunneling occurs. As a result, memory cells of the unselected word lines will not be erased. A select gate transistor can be erased similarly.

FIG. 3C depicts a cross-sectional view of the NAND string of FIG. 3B along line 294. Each layer is ring-shaped in one possible approach, except the core filler, which is cylindrical.

Figure 3D:
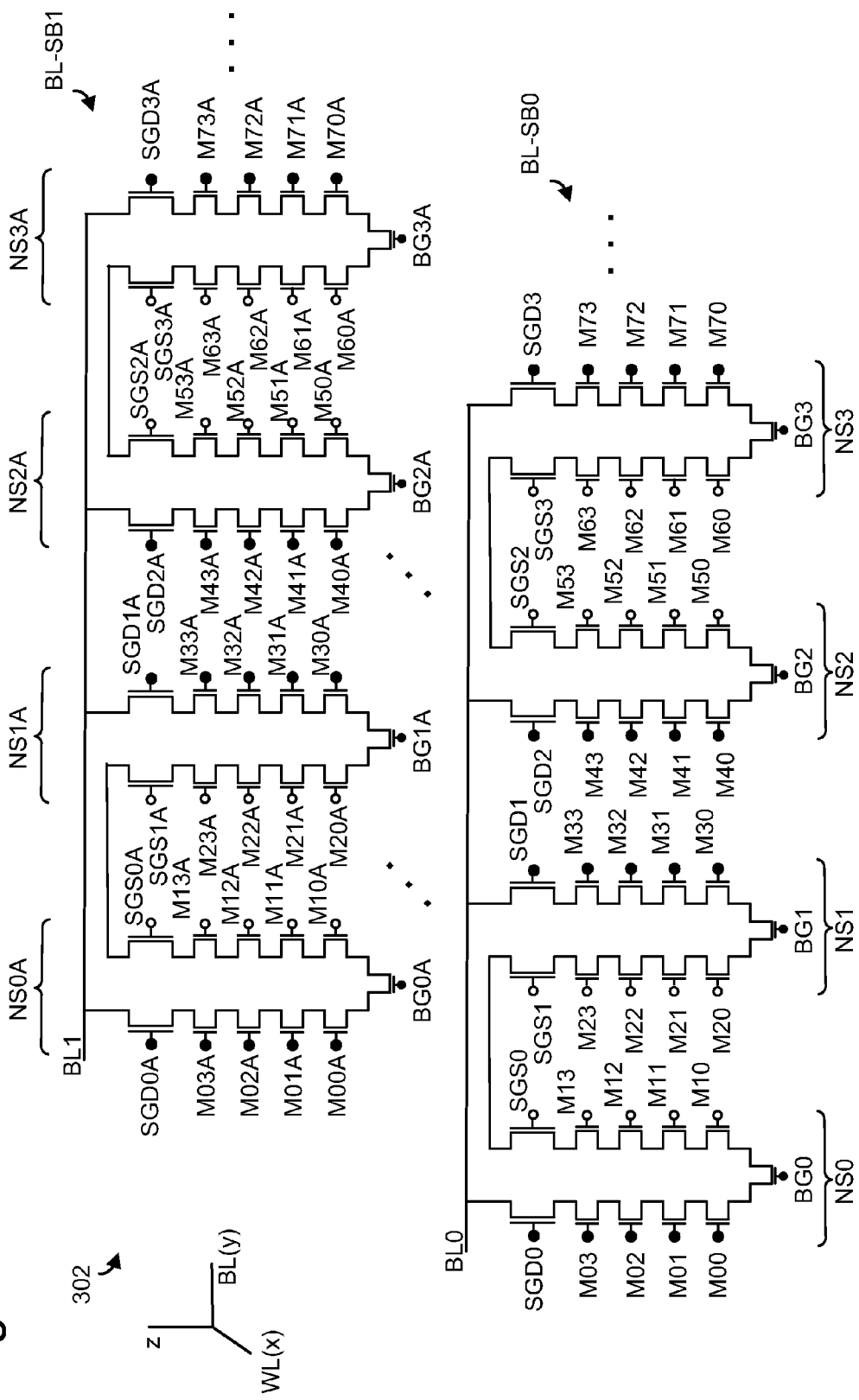
FIG. 3D depicts an example circuit in a 3D memory device which includes the NAND string NS0 of FIG. 3B.

FIG. 3D depicts an example circuit in a 3D memory device which includes the NAND string NS0 of FIG. 3B. NAND strings NS0, NS1, NS2 and NS3 are in communication with a bit line BL0 (one bit line) in BL-SB0 (a bit line sub-block), and NAND strings NS0A, NS1A, NS2A and NS3A are in communication with a bit line BL1 (another bit line) in BL-SB1 (another bit line sub-block). The filled in circles indicate control gates of the SG transistor and the memory cells on the drain side of a NAND string. The open circles indicate control gates of the SG transistor and the memory cells on the source side of a NAND string.

For example, NS0 has a drain side comprising memory cells M00, M01, M02 and M03 and an SGD transistor SGD0, and a source side comprising memory cells M10, M11, M12 and M13 and an SGS transistor SGS0. NS1 has a drain side comprising memory cells M30, M31, M32 and M33 and an SGD transistor SGD1, and a source side comprising memory cells M20, M21, M22 and M23 and an SGS transistor SGS1. NS2 has a drain side comprising memory cells M40, M41, M42 and M43 and an SGD transistor SGD2, and a source side comprising memory cells M50, M51, M52 and M53 and an SGS transistor SGS2. NS3 has a drain side comprising memory cells M70, M71, M72 and M73 and an SGD transistor SGD3, and a source side comprising memory cells M60, M61, M62 and M63 and an SGS transistor SGS3.

Similarly, NS0A has a drain side comprising memory cells M00A, M01A, M02A and M03A and an SGD transistor SGD0A, and a source side comprising memory cells M10A, M11A, M12A and M13A and an SGS transistor SGS0A. NS1A has a drain side comprising memory cells M30A, M31A, M32A and M33A and an SGD transistor SGD1A, and a source side comprising memory cells M20A, M21A, M22A and M23A and an SGS transistor SGS1A. NS2A has a drain side comprising memory cells M40A, M41A, M42A and M43A and an SGD transistor SGD2A, and a source side comprising memory cells M50A, M51A, M52A and M53A and an SGS transistor SGS2A. NS3A has a drain side comprising memory cells M70A, M71A, M72A and M73A and an SGD transistor SGD3A, and a source side comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit 302 may be connected to one another.

In one approach, the source side of each SGS transistor is connected to a common source line of the circuit 302

At each level of the circuit 302, the control gates of the drain-side memory cells are connected to one another by a common word line layer. For example, M03, M03A, M33, M33A, M43, M43A, M73 and M73A have control gates connected by the word line layer WL3D, consistent with FIG. 3B. M13, M13A, M23, M23A, M53, M53A, M63 and M63A have control gates connected by the word line layer WL3S.

M02, M02A, M32, M32A, M42, M42A, M72 and M72A have control gates connected by the word line layer WL2D. M12, M12A, M22, M22A, M52, M52A, M62 and M62A have control gates connected by the word line layer WL2S.

M01, M01A, M31, M31A, M41, M41A, M71 and M71A have control gates connected by the word line layer WL1D. M11, M11A, M21, M21A, M51, M51A, M61 and M61A have control gates connected by the word line layer WL1S.

M00, M00A, M30, M30A, M40, M40A, M70 and M70A have control gates connected by the word line layer WL0D. M10, M10A, M20, M20A, M50, M50A, M60 and M60A have control gates connected by the word line layer WL0S.

Additionally, control gates of the SGD transistors are connected to one another in respective SGD line subsets. For example, control gates of SGD0 and SGD0A are connected, control gates of SGD1 and SGD1A are connected, control gates of SGD2 and SGD2A are connected, and control gates of SGD3 and SGD3A are connected.

The control gates of the SGS transistors are connected to one another in the x-direction. For example, control gates of SGS0 and SGS0A are connected, control gates of SGS1 and SGS1A are connected, control gates of SGS2 and SGS2A are connected, and control gates of SGS3 and SGS3A are connected. In a programming operation, the memory cells can be programmed in different ways. In one approach, the memory cells in a bit line subset (or multiple bit line subsets) can be programmed in a common programming operation. Similarly, the SG transistors can be programmed individually or concurrently in an SGD line subset.

Figure 4A:
FIGS. 4A and 4B depict an example one-pass programming operation in which lower and upper pages of data are written concurrently.
Figure 4B:
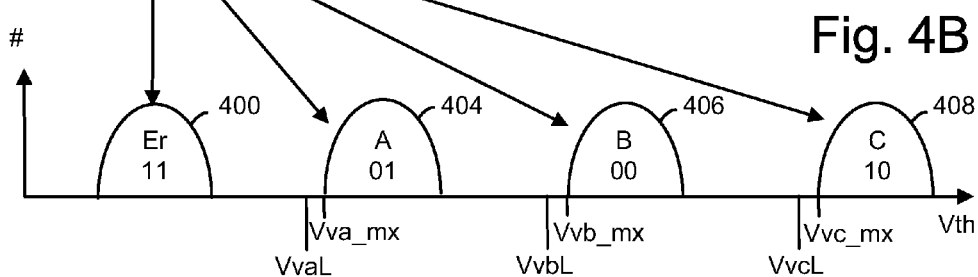

FIGS. 4A and 4B depict an example one-pass programming operation in which lower and upper pages of data are written concurrently. A programming pass, or programming operation, is generally meant to encompass a sequence of program-verify iterations which are performed until the threshold voltages of a set of selected memory cells reach one or more respective verify levels of respective target data states. Some of the memory cells are not programmed and remain in the erased state while others are programmed to higher target data states.

Example Vth distributions are provided for a case where each memory cell stores two bits of data. Each graph depicts Vth on the x-axis and a number or population of memory cells in a Vth distribution on the y-axis. One bit represents the LP data and the other bit represents the UP data. For example, 11 denotes UP=1 and LP=1, 01 denotes UP=0 and LP=1, 00 denotes UP=0 and LP=0 and 10 denotes UP=1 and LP=0. A first Vth distribution 400 is provided for erased (Er) state memory cells. Vth distributions 404, 406 and 408 represent target data states A, B and C, respectively, which are reached by memory cells when their Vth exceeds a verify level Vva_mx, Vvb_mx or Vvc_mx, respectively.

A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. When QPW is used, lower verify levels (VvaL, VvbL or VvcL) are defined such that the memory cells enter a slow programming mode (e.g., by raising the associated bit line voltages applied during the program pulse) when their Vth is between the lower verify level and the higher, lockout verify level of a respective target data state. Specifically, when a verify test determines that the Vth of a memory cell exceeds the lower verify level associated with the target data state of the memory cell, a slow programming mode begins for the memory cell. Subsequently, when a verify test determines that the Vth of the memory cell exceeds the higher verify level associated with the target data state of the memory cell, the memory cell is locked out from further programming. The lower verify level can change dynamically in concert with the dynamic lockout verify level. See FIG. 12D for an example.

In some cases, QPW is used on fewer than all target data states. For example, a wider Vth distribution may be acceptable for the highest data state (e.g., the C state in this example). Total programming time may be reduced by avoiding the use of QPW with the highest data state, since the time spent in sensing whether the Vth exceeds VvcL can be avoided. Generally, QPW can be used for selected target data states based on testing which identifies the target data states for which QPW yields the most benefit.

Read reference voltages which are between the distributions are used for reading data from the memory cells. By testing whether the Vth of a given memory cell is above or below one or more of the read reference voltages, the system can determine the data state which is represented by a memory cell.

Figure 5A:
FIGS. 5A to 5C depict a two-pass programming operation in which lower and upper pages of data are written in first and second passes, respectively.
Figure 5B:
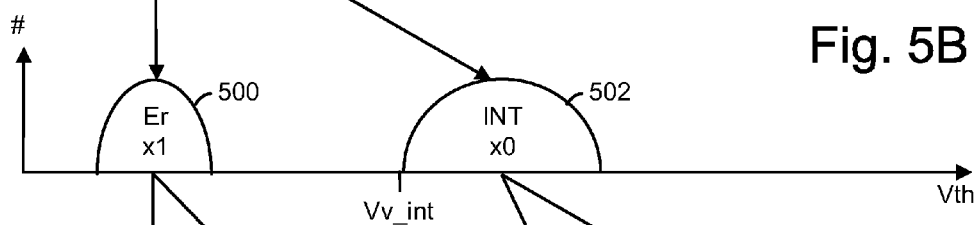
Figure 5C:
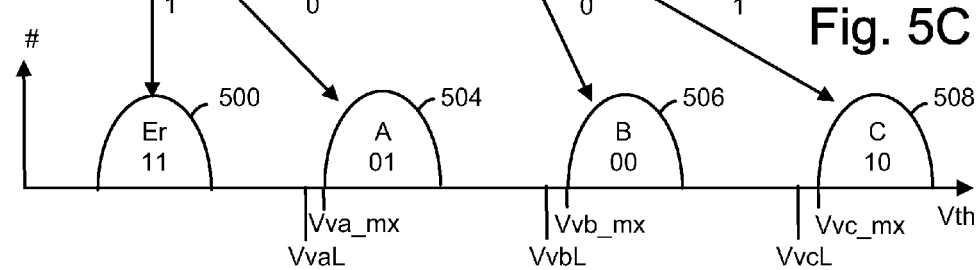

FIGS. 5A to 5C depict a two-pass programming operation in which lower and upper pages of data are written in first and second passes, respectively, using two-bit, four-level memory cells. Programming can be performed one logical page at a time, with the lower page followed by the upper page. Initially, all memory cells are in the Er state, represented by the distribution 500 in FIG. 5A.

FIG. 5B depicts programming of a lower page of data. If the lower page has a bit=1, the associated memory cell remains in the distribution 500 and the data is represented by x1, where x is an upper page bit that is not yet known. If the lower page has a bit=0, the memory cell is programmed to a higher Vth as represented by distribution 502, which is an interim distribution (INT), using a verify level Vv_int. The data of these memory cells is represented by x0. The interim distribution can be relatively wide since it is does not represent a data state.

FIG. 5C depicts programming of an upper page of data. If UP/LP=11, the associated memory cell in the distribution 500 remains in the distribution 500 and stores data bits 11. If UP/LP=01, the memory cells in the distribution 500 are programmed to the distribution 504 (state A) and a slow programming mode can be used when the Vth is between VvaL and Vva_mx. If UP/LP=10, the memory cells in the distribution 502 are programmed to the distribution 508 (state C) and a slow programming mode can be used when the Vth is between VvcL and Vvc_mx. If UP/LP=00, the memory cells in the distribution 502 are programmed to the distribution 506 (state B) and a slow programming mode can be used when the Vth is between VvbL and Vvb_mx.

Programming can be similarly extended to three or more bits per memory cell. For example, FIGS. 6A to 6D depict a three-pass programming operation in which lower, middle and upper pages of data are written in first, second and third passes, respectively.

Programming of lower, middle and upper pages in three-bit, eight-level memory cells is depicted. Seven programmed data states A through G are used in addition to Er for eight states total. Initially, all memory cells are in the Er state, represented by the distribution 600. The lower page is programmed in FIG. 6B. If LP=1, memory cells in distribution 600 remain in that distribution. If LP=0, memory cells in distribution 600 are programmed to an interim distribution 602 using Vv1. The middle page is programmed in FIG. 6C. If MP=1, memory cells in distribution 600 remain in that distribution, and memory cells in distribution 602 are programmed to interim distribution 608 using verify level Vv4. If MP=0, memory cells in distribution 600 are programmed to interim distribution 604 using verify level Vv2, and memory cells in distribution 602 are programmed to interim distribution 606 using verify level Vv3.

Figure 6D:
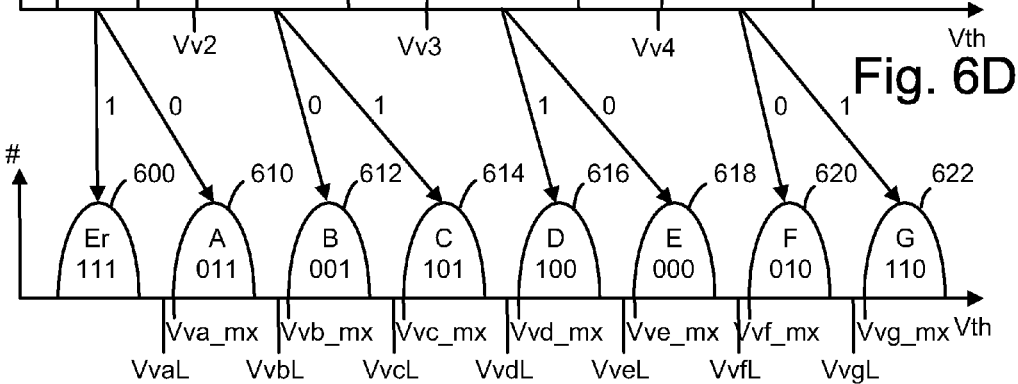

The upper page is programmed in FIG. 6D. QPW is used for this pass. If UP=1, memory cells in distribution 600 remain in that distribution, memory cells in distribution 604 are programmed to distribution 614 (state C), memory cells in distribution 606 are programmed to distribution 616 (state D), and memory cells in distribution 608 are programmed to distribution 622 (state G). If UP=0, memory cells in distribution 600 are programmed to distribution 610 (state A), memory cells in distribution 604 are programmed to distribution 612 (state B), memory cells in distribution 606 are programmed to distribution 618 (state E), and memory cells in distribution 608 are programmed to distribution 620 (state F).

Programming using four bits per cell (16 levels) can similarly involve four pages. Additionally, when programming multiple pages of data, a back and forth word line order may be used to reduce potential disturbs from capacitive coupling.

Figure 7A:
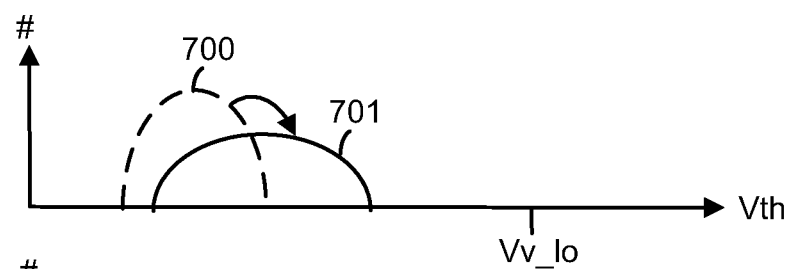
FIGS. 7A to 7C depict a change in a threshold voltage distribution of a set of transistors during a programming operation which uses a fixed lockout verify level.
Figure 7B:
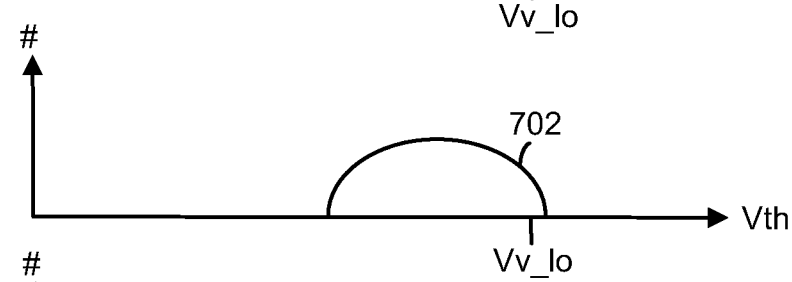
Figure 7C:
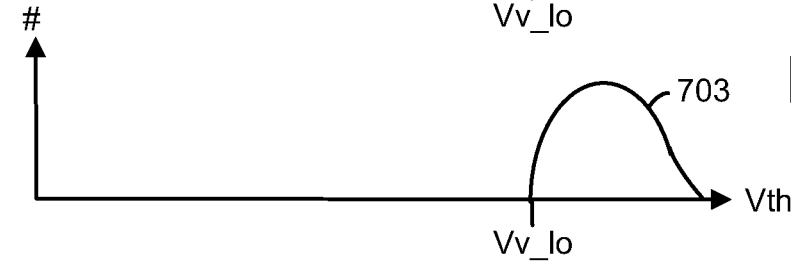

FIGS. 7A to 7C depict a change in a threshold voltage distribution of a set of transistors during a programming operation which uses a fixed lockout verify level. The set of transistors have an initial distribution 700 (such as the Er state or the INT state in FIG. 5B or the states 604, 606 and 608 in FIG. 6C). During the programming operation, the Vth distribution increases to a distribution 701 which represents a natural Vth distribution of the set of transistors. The Vth distribution increases further until some of the fastest transistors reach the lockout verify level, Vvv_lo, which is fixed in this example, as represented by a distribution 702 (FIG. 7B). The Vth distribution increases further until all or almost all of the transistors reach Vvv_lo (distribution 703 in FIG. 7C). As mentioned, due to program disturb, the threshold voltages of faster-programming transistors can increase after the transistors are locked out from programming, thereby widening the final Vth distribution. To address this problem, a dynamic or adjustable verify level can be used.

Figure 8A:
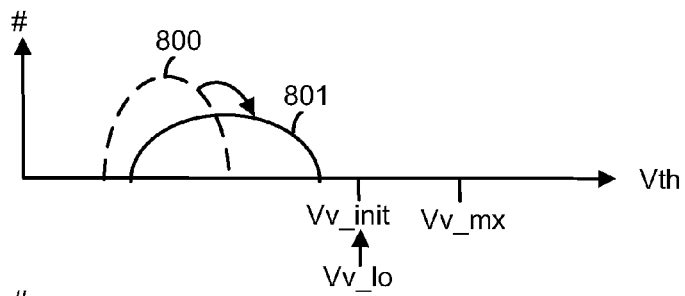
FIGS. 8A to 8K depict a change in a threshold voltage distribution of a set of transistors during a programming operation which uses a dynamic verify level.
Figure 8B:
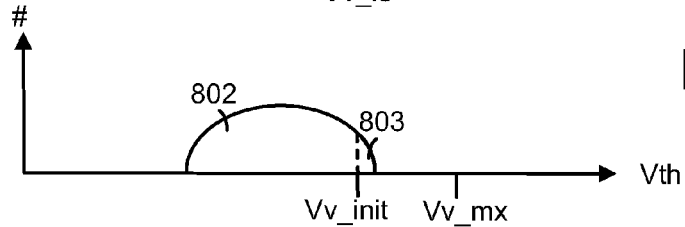

FIGS. 8A to 8K depict a change in a threshold voltage distribution of a set of transistors during a programming operation which uses a dynamic verify level. In FIG. 8A, the set of transistors have an initial distribution 800 (such as the Er state or the INT state in FIG. 5B or the states 604, 606 and 608 in FIG. 6C). During the programming operation, one or more initial program-verify iterations are performed, causing the Vth distribution 800 to increase to a distribution 801 which represents a natural Vth distribution of the set of transistors. The Vth distribution is below an initial verify level, Vv_init and a maximum allowed verify level, Vv_mx. When programming SG transistors, Vv_init=Vvsg_init and Vv_mx=Vvsg_mx (see FIG. 16E). When programming memory cell transistors, Vv_init and Vv_mx can have different values for different target data states. For A-, B- and C-states, Vv_init=Vva_init, Vvb_init and Vvc_init, respectively, and Vv_mx=Vva_mx, Vvb_mx and Vvc_mx, respectively (see FIGS. 11C and 12C). Vv_lo represents a dynamic verify level which increase from Vv_init to Vv_mx during a programming operation.

In one approach, Vv_lo=Vv_init for one or more initial program-verify iterations of a programming operation. Subsequently, Vv_lo is stepped up in multiple program-verify iterations of the programming operation. Subsequently, the multiple program-verify iterations are concluded, and one or more final program-verify iterations begin in which Vv_lo is set to Vv_mx. For example, in FIG. 8B, a Vth distribution is reached having distribution portions 802 and 803. The portion 803 represents the fastest programming transistors for which the Vth has reached the current value of Vv_lo. These transistors have their status changed from a program status to a lockout status for a remainder of the programming operation/pass. As shown in FIG. 8G, the portion 803 experiences program disturb, increasing to the distribution 804 at an end of the programing operation. The distribution portion 802 represents the remaining transistors for which the Vth has not reached the current value of Vv_lo and these transistors continue programming with a program status.

One option is to begin stepping up Vv_lo when a specified portion (e.g., 10%) of the transistors which are being programmed to a common verify level (Vv_mx) reach the associated initial verify level (Vv_init). Vv_lo can be stepped up in each successive program-verify iteration of the programming operation, in one approach. Moreover, the step up amount can be fixed or varying. In one approach, progressively smaller step sizes are used.

Figure 8C:
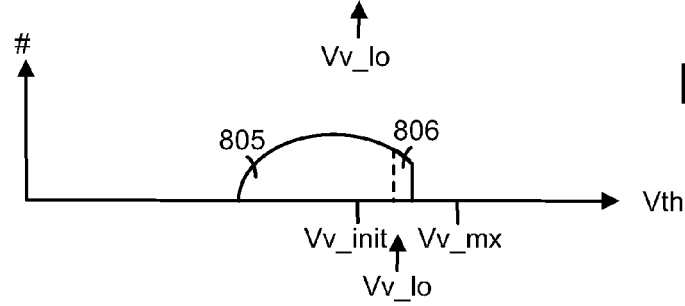

In FIG. 8C, the distribution 802 increases to provide distribution portions 805 and 806. The portion 806 represents the transistors for which the Vth has reached the current value of Vv_lo. These transistors have their status changed from a program status to a lockout status for a remainder of the programming operation/pass. As shown in FIG. 8H, the portion 806 experiences program disturb, increasing to the distribution 807 at an end of the programing operation. The distribution portion 805 represents the remaining transistors for which the Vth has not reached the current value of Vv_lo and these transistors continue programming with a program status.

Figure 8D:
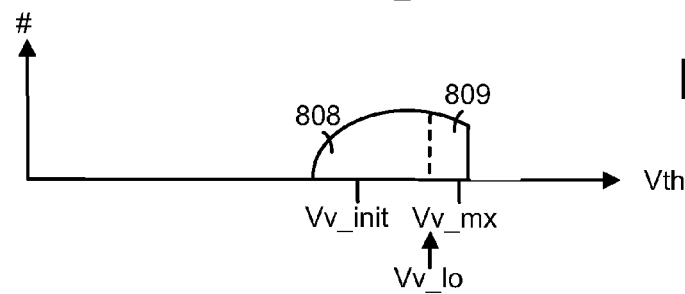

In FIG. 8D, the distribution 805 increases to provide distribution portions 808 and 809. The portion 809 represents the transistors for which the Vth has reached the current value of Vv_lo. These transistors have their status changed from a program status to a lockout status for a remainder of the programming operation/pass. As shown in FIG. 8I, the portion 809 experiences program disturb, increasing to the distribution 810 at an end of the programing operation. The distribution portion 808 represents the remaining transistors for which the Vth has not reached the current value of Vv_lo and these transistors continue programming with a program status.

Figure 8E:
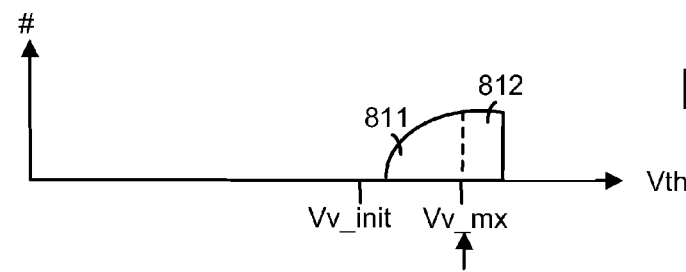

In FIG. 8E, the distribution 808 increases to provide distribution portions 811 and 812. The portion 812 represents the transistors for which the Vth has reached the current value of Vv_lo. These transistors have their status changed from a program status to a lockout status for a remainder of the programming operation/pass. As shown in FIG. 8J, the portion 812 may experience a small amount of program disturb. increasing to the distribution 813 at an end of the programing operation. The distribution portion 811 represents the remaining transistors for which the Vth has not reached the current value of Vv_lo and these transistors continue programming with a program status.

Figure 8F:
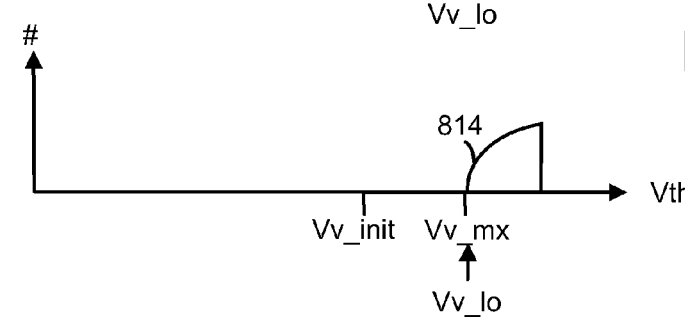
Figure 8G:
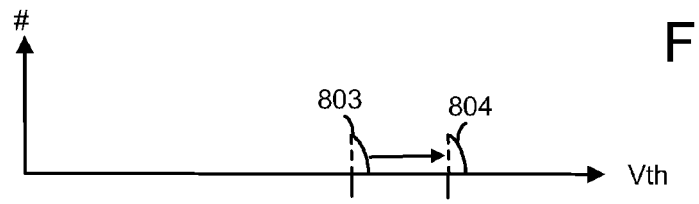
Figure 8H:
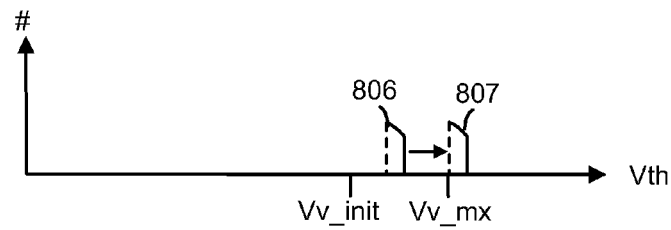
Figure 8I:
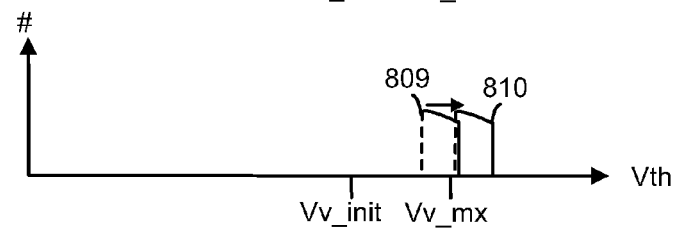
Figure 8J:
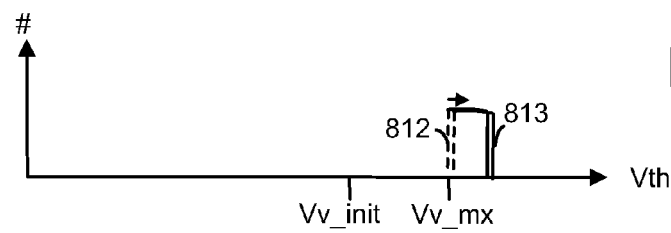

In FIG. 8F, the distribution 811 increases to provide the distribution 813, which represents the transistors for which the Vth has reached the current value of Vv_lo. These remaining transistors have their status changed from a program status to a lockout status for a remainder of programming operation/pass.

Figure 8K:
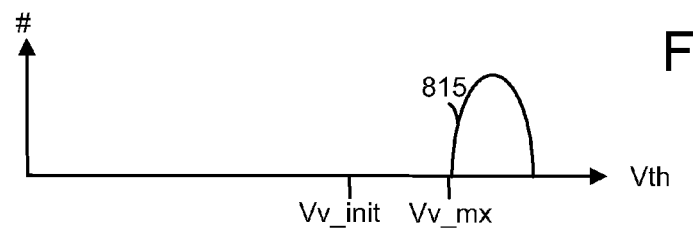

FIG. 8K represents a final Vth distribution 815 which is a combination of the distribution 814 of FIG. 8F, the distribution 804 of FIG. 8G, the distribution 807 of FIG. 8H, the distribution 810 of FIG. 8I and the distribution 813 of FIG. 8J. The final Vth distribution 815 is narrower than in FIG. 7C due to the use of the dynamic verify level, which counteracts the effects of program disturb. In fact, program disturb is used as a tool to achieve the desired narrow Vth distribution. Thus, for at least some of the transistors, a threshold voltage increases after changing the program status to the lockout status, bringing threshold voltages of faster-programming transistors of the set of transistors closer to threshold voltages of slower-programming transistors of the set of transistors.

Figure 9A:
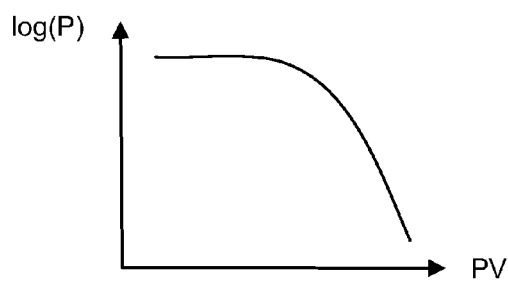
FIG. 9A depicts a probability that a bit line adjacent memory cell has a program status as a function of a program-verify (PV) iteration in a programming operation.

FIG. 9A depicts a probability that a bit line adjacent memory cell has a program status as a function of a program-verify (PV) iteration in a programming operation. In a given program-verify iteration, some memory cells will have a program status and other memory cells will have a lockout status. Moreover, when a slow programming mode is used, e.g., Vbl is raised to slow the rate of programming, the program status can also indicate that the slow programming mode is active.

Or, the program status can indicate that fast programming mode is active, where Vbl=0 V. If we consider program disturb among memory cells that are programmed to the same Vth level (the same target data state), the faster-programming memory cell wills reach the lockout status relatively sooner than the slower-programming memory cells and are subsequently more likely to experience program disturb from a bit line adjacent memory cell (a memory cell on an adjacent bit line and on the same word line as a subject memory cell). For example, in FIG. 2A, memory cells 230 and 250 are bit line adjacent memory cells of memory cell 240.

In practice, the memory cells can be programmed to different Vth levels in a programming operation, in which case the likelihood of capacitive coupling and the amount of capacitive coupling may be greater for memory cells programmed to lower data states.

For example, FIG. 9A shows that the logarithmic probability is at a maximum level for lower program-verify iterations, then decreases at higher program-verify iterations. As mentioned, a memory cell with the lockout status can experience program disturb in the form of capacitive coupling from a bit line adjacent memory cell which has the program status and therefore has an increasing Vth. The amount of capacitive coupling in a given program-verify iteration is a function of the increase in the Vth of the bit line adjacent memory cell and a coupling ratio. Typically, the target data states of a set of memory cells are randomly distributed. In the case of binary programming, where there is an erased state and a programmed state, the maximum level of the logarithmic probability is 0.50. When four data states are used, the maximum level of the logarithmic probability is 0.25.

Referring to the programming of FIG. 5C, for instance, the A-state memory cells are programmed at the same time as the B- and C-state memory cells. Moreover, the A-state memory cells will typically reach the lockout status before the B- and C-state memory cells, and the B-state memory cells will typically reach the lockout status before the C-state memory cells. Thus, the A-state memory cells will receive the most capacitive coupling, the B-state memory cells will receive less capacitive coupling, and the C-state memory cells will receive the least capacitive coupling.

Figure 9B:
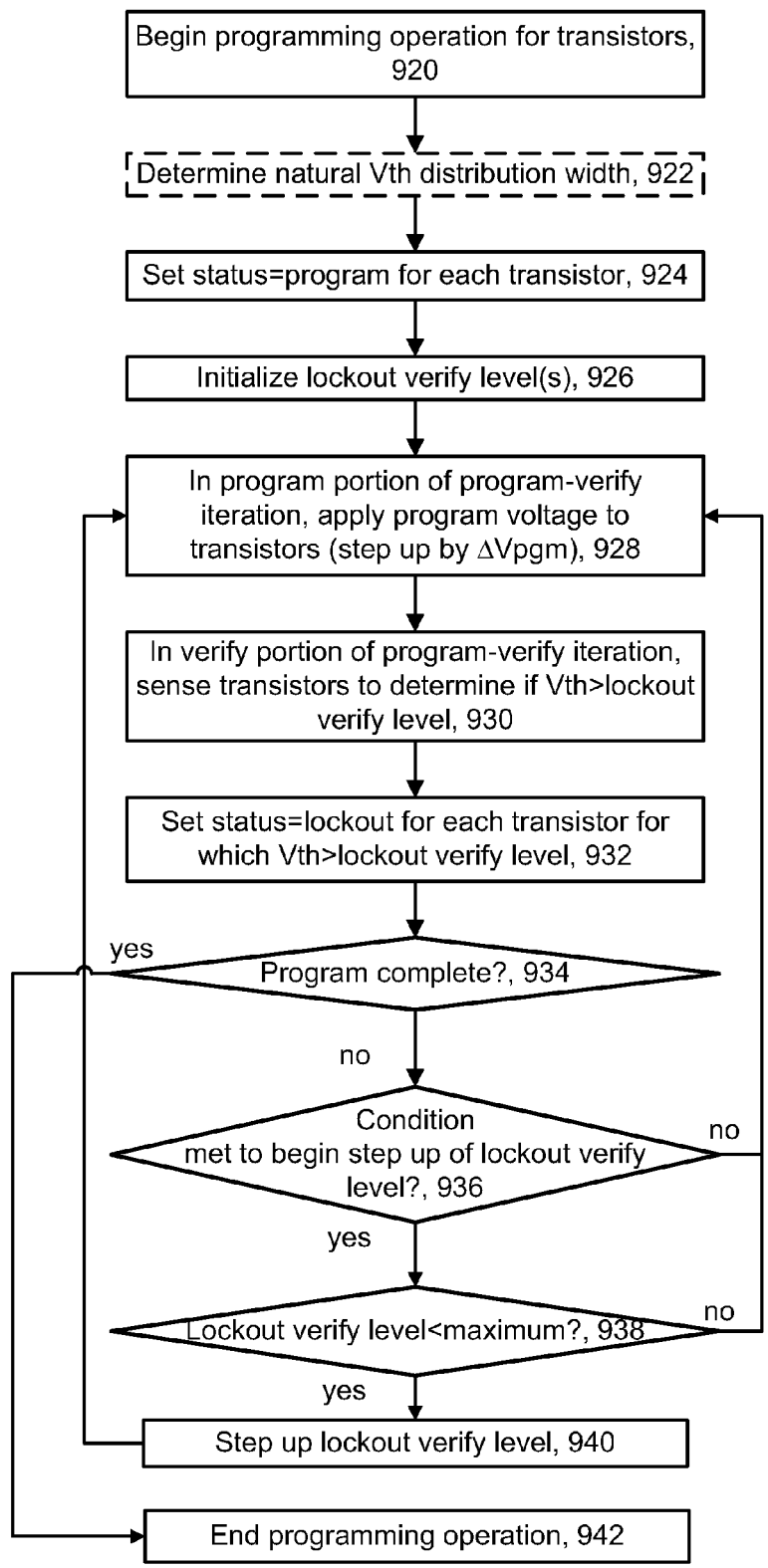
FIG. 9B depicts a flowchart of a programming operation which uses a dynamic verify level.

FIG. 9B depicts a flowchart of a programming operation which uses a dynamic verify level. The process is applicable to SG or memory cell transistors. For memory cells, a different dynamic verify level can be provided for different target data states. Step 920 begins the programming operation for the transistors. Step 922 optionally determines a natural Vth distribution width for the set of transistors, as discussed further in connection with FIGS. 10A to 10D. Step 924 sets a status=program for each transistor. Step 926 initializes a lockout verify level, Vv_lo. For example, referring to the programming of FIG. 5C, the lockout verify levels for the A-, B- and C-states can be initialized as Vva_lo=Vva_init, Vvb_lo=Vvb_init and Vvc_lo=Vvc_init. Note that the lockout verify level can be dynamic for some target data states but not others. For example, in some cases it is acceptable for the highest target data state (e.g., the C-state) to have a wider distribution, in which case the lockout verify level can be fixed for the C-state to provide a simpler implementation. For programming of SG transistors, the lockout verify level, Vvs-g_lo, is initialized to Vvsg_init (see FIG. 14B).

Step 928 represents a program portion of a program-verify iteration, where a program voltage is applied to the control gates of the transistors. The program voltage (Vpgm) can be stepped up in each program-verify iteration by a step size ΔVpgm. The program voltage can be applied, e.g., to the control gates of the transistors. For memory cells, the program voltage can be applied via a respective word line. During the program pulse of each program-verify iteration of the program-verify iterations for the set of transistors, a respective drain voltage of the transistor (e.g., Vbl) is set at a lockout level (Vdd) for transistors having the lockout status and at a program level (0 V or Vqpw) for transistors having the program status. The program voltages and the step sizes can be different for memory cells versus the SG transistors.

Step 930 represents a verify portion of a program-verify iteration, where the transistors are sensed to determine if Vth> lockout verify level. In the case of programming memory cells, the sensing can be performed for each of the different target data states. One approach to determining if Vth> lockout verify level is to apply a voltage at the lockout verify level to the control gate of the transistor and determine whether the transistor is in a non-conductive state. If the transistor is in a non-conductive state, Vth> lockout verify level. Another approach to determining if Vth> lockout verify level is to apply a specified voltage (different than the lockout verify level) to the control gate of the transistor and determine an amount of current that flows through the transistor. If the amount of current is less than a specified level, Vth> lockout verify level. Step 932 sets a lockout status for each transistor for which Vth> lockout verify level, i.e., for each transistor which passes the verify test.

Decision step 934 determines if programming is complete. Decision step 934 may be true when all, or nearly all, of the transistors being programmed have a lockout status. If programming is complete, the programming operation ends at step 942. If decision step 934 is false, a decision step 936 determines if a condition is met to begin a step up of the lockout verify level. For example, this condition can be met when a specified number or portion Ns of the transistors have a Vth> initial verify level or another verify level. For example, Ns can be 10-20% of Ncells, the number of memory cells being programmed to a target data state (see also FIGS. 11B, 12B and 13B). The decision to step up the lockout verify level can be made separately for each target data state. A count can be provided of the portion of the transistors which meet the specified criterion and decision step 936 declared true when the count exceeds a specified value.

This approach is adaptive since it does not start the step up of the lockout verify level until the programming has progressed to a certain extent. This approach is an example of adaptively determining, based on a programming progress of the set of transistors, when to begin multiple program-verify iterations in which the lockout verify level is stepped up. The step up will begin relatively sooner in the programming operation when the transistors are relatively fast programming, and relatively later in the programming operation when the transistors are relatively slow programming. This approach can result in an optimal Vth distribution since it tailors the step up based on the programming progress of the particular transistors which are being programmed. Another option is to declare step 936 to be true when a predetermined number of program-verify iterations have been performed. This approach avoids complexity.

If decision step 936 is true, decision step 938 determines if the current lockout verify level is less than the maximum allowed level (e.g., Vva_mx, Vvc_mx or Vvc_mx for the A-, B- or C-states, or Vvsgd_mx for the SG transistors). If decision step 938 is true, the lockout verify level is stepped up for the next program-verify iteration at step 940. As mentioned, the step up can be, e.g., linear or progressively smaller with each successive program-verify iteration. Generally, the initial level and the rate of step up can be optimized for a memory device. The optimization can specify the number of program-verify iterations over which the verify level is stepped up (e.g., the number of steps) and the amount of step up in each program-verify iteration. The number of steps can be two, three, four or more. Further, the step up can be in consecutive and/or non-consecutive program-verify iterations.

If decision step 938 is false, the lockout verify level is at the maximum and is therefore not stepped up for the next program-verify iteration. After step 940 or 936, the program portion of the next program-verify iteration is again performed at step 928. A limit can be imposed on the number of program-verify iterations such that the programming operation fails if it does not complete within a maximum number of program-verify iterations.

FIG. 10A depicts a flowchart of a process to determine a natural Vth distribution width for a set of transistors in accordance with step 922 of FIG. 9B. A group of transistors will have a natural Vth distribution which is a function of small variations in the transistors. In one approach, the width of the natural Vth distribution is determined at the time of manufacturing and represented by data stored in the memory device, e.g., in the state machine. Before a programming operation, this data can be accessed and used to adjust the programming operation. The natural Vth distribution width could also be determined from time to time by the memory device. In one approach, the natural Vth distribution width for a set of transistors is determined from a subset of the transistors. For example, the natural Vth distribution width for one word line of memory cells can be determined and used to represent the natural Vth distribution width of a block of memory cells. By considering the natural Vth distribution width, the step up of the lockout verify level for a set of transistors can be is optimized.

Step 1000 begins an operation to determine the natural Vth distribution width (ND) for a set of transistors. At step 1002, a program voltage is applied to the transistors. The program voltage (Vpgm) can be stepped up in each program-verify iteration by a step size ΔVpgm. At step 1004, the transistors are sensed to determine if Vth>Vch, where Vch is a checkpoint verify level as shown in FIGS. 10B to 10D. Step 1006 provides a count of a number (#) of transistors for which Vth>Vch. Decision step 1008 determines if the number is >Nd, where Nd is a number which represents a specified portion such as 10% of the number of transistors being programmed. If decision step 1008 is false, step 1002 is repeated. If decision step 1008 is true, step 1010 indicates that a first checkpoint has been reached for the transistors, and the current program-verify iteration number (PV#) is recorded as a value PV1. FIG. 10C depicts the case where decision step 1008 is true.

At step 1012, a next program voltage is applied to the transistors. At step 1014, the transistors are sensed to determine if Vth<Vch. Step 1016 provides a count of a number (#) of transistors for which Vth<Vch. Decision step 1018 determines if the number is <Nd, where Nd has the same value as in step 1008. If decision step 1018 is false, step 1012 is repeated. The program voltage (Vpgm) can be stepped up in each program-verify iteration by a step size ΔVpgm. If decision step 1018 is true, step 1020 indicates that a second checkpoint has been reached for the transistors, and the current program-verify iteration number (PV#) is recorded as a value PV2. Step 1022 determines the natural Vth distribution width as (PV2−PV1)×ΔVpgm.

FIGS. 10B to 10D depict a change in a threshold voltage distribution of a set of transistors during the process for determining a natural Vth distribution width of FIG. 10A. FIG. 10B depicts an initial Vth distribution 1030 which transitions to the natural Vth distribution 1031. A natural Vth distribution is a distribution in which the different programming speeds of the different transistors can be seen. With further programming, the distribution 1031 transitions to a distribution portion 1032 representing transistors for which Vth<Vch and a distribution portion 1033 representing transistors for which Vth>Vch. The transistors are not locked out in this process. With further programming, the distribution portions 1032 and 1033 transition to the distribution portion 1034 representing transistors for which Vth<Vch and a distribution portion 1035 representing transistors for which Vth>Vch.

Figure 11A:
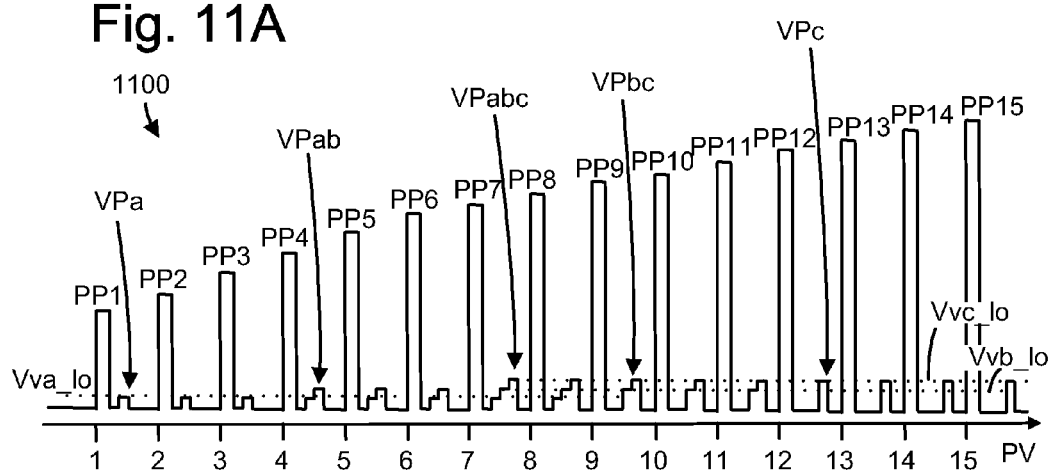
FIG. 11A depicts voltages used in a one-pass programming operation such as depicted in FIGS. 4A and 4B.

FIG. 11A depicts voltages used in a one-pass programming operation such as depicted in FIGS. 4A and 4B. The horizontal axis depicts program-verify iteration number (PV), which is also the program pulse number, and the vertical axis depicts control gate or word line voltage. Generally, a programming operation includes successive program-verify iterations. Each program-verify iteration has a program portion in which a program pulse (PP) is applied to the control gates of the memory cells via a selected word line, followed by a verify portion in which one or more verify pulses (VP) are applied to the control gates of the memory cells while at least some of the memory cells are sensed.

The voltage waveform 1100 depicts a series of program pulses PP1 to PP15 and verify pulse. One, two or three verify levels are provided after each program pulse, as an example, based on the target data states which are being verified. 0 V may be applied to the selected word line between the program and verify pulses. For example, an A-state verify pulse (e.g., VPa) at a level of Vva_lo may be applied after each of PP1 to PP3. A- and B-state verify pulses (e.g., VPab) at levels of Vva_lo and Vvb_lo, respectively, may be applied after each of PP4 to PP6. A-, B- and C-state verify pulses (e.g., VPabc) at levels of Vva_lo, Vvb_lo and Vvc_lo, respectively, may be applied after each of PP7 and PP8. B- and C-state verify pulses (e.g., VPbc) at levels of Vvb_lo and Vvc_lo, respectively, may be applied after each of PP10 to PP12. Finally, a C-state verify pulse (e.g., VPc) at a level of Vvc_lo may be applied after each of PP12 to PP15. This approach reduces the number of verify operations which are performed.

Figure 11B:
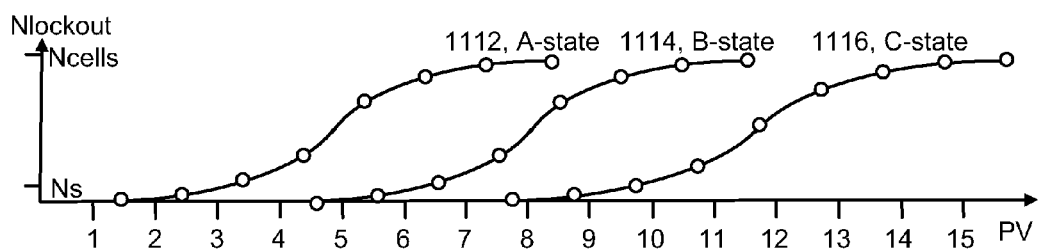
FIG. 11B depicts a number of memory cells which have a lockout status as a function of program-verify iteration in the programming operation of FIG. 11A.

FIG. 11B depicts a number (Nlockout) of memory cells which have a lockout status as a function of program-verify iteration in the programming operation of FIG. 11A. The x-axis depicts the PV# and is aligned with FIG. 11A. The y-axis depicts a number (Nlockout) of the memory cells which have the lockout status after the current program-verify iteration. Each circle represents a data point and is aligned with the corresponding verify pulse of the PV iteration. Curves 1112, 1114 and 1116 include data points for the A-, B- and C-state memory cells, respectively. Nlockout is initially at zero and then transitions toward Ncells, the number of memory cells being programmed for each target data state. The number of memory cells having the program status is Ncells-Nlockout for each target data state.

The shape of each curve is based on a normal Vth distribution for a given data state, such that a smaller number of memory cells will initially transition to the lockout status after a few PV iterations, then a larger number of memory cells will transition to the lockout status after a few more PV iterations, and finally a smaller number of memory cells will transition to the lockout status after a few more PV iterations.

Figure 11C:
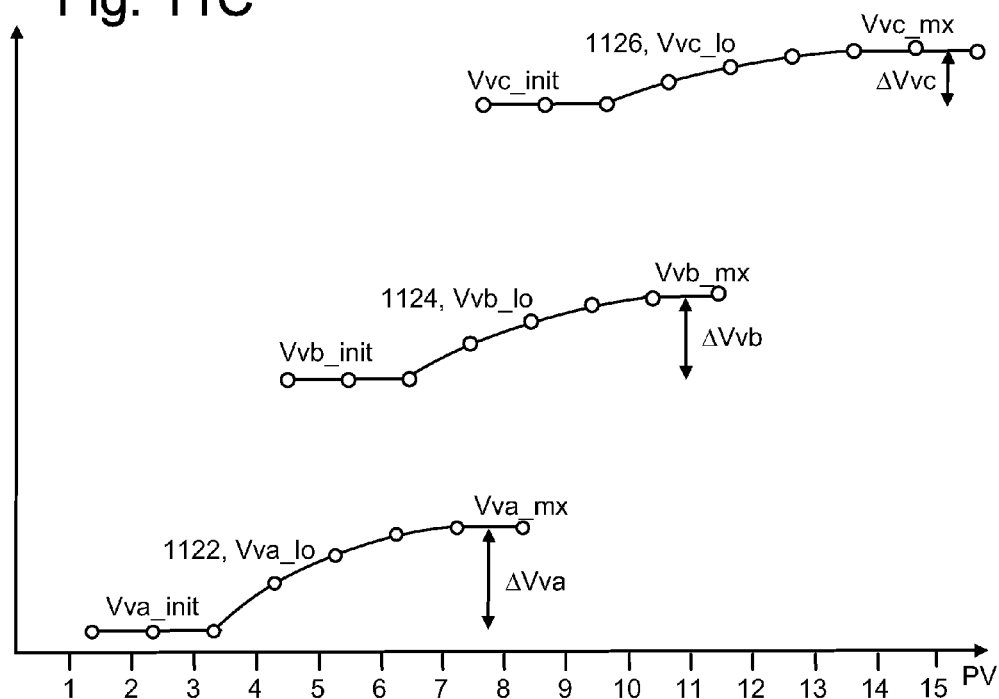
FIG. 11C depicts example dynamic verify voltages for A-, B- and C-state memory cells as a function of program-verify iteration in the programming operation of FIG. 11A.

FIG. 11C depicts example dynamic verify voltages for A-, B- and C-state memory cells as a function of program-verify iteration in the programming operation of FIG. 11A. Curves 1122, 1124 and 1126 include data points which represent Vva_lo, Vvb_lo and Vvc_lo. According to curve 1122, Vva_lo is at Vva_init during PV1 to PV3. These are one or more initial program-verify iterations for a set of A-state transistors. During PV3, Nlockout (FIG. 11B) for the A-state (curve 1112) transitions above Ns to trigger the step up in Vva_lo in the following program-verify iterations, until Vva_lo reaches Vva_mx, at which time Vva_lo is held at Vva_mx for a remainder of the program-verify iterations for the A-state. In particular, Vva_lo is stepped up in PV4 to PV7 in a range of voltages from Vva_init to Vva_mx (a range of ΔVva), and kept at Vva_mx in PV8. PV4 to PV7 are multiple program-verify iterations in which the lockout verify voltage is stepped up. The multiple program-verify iterations are concluded and the one or more final program-verify iterations (PV8) begin for the set of A-state transistors when the lockout verify voltage has been stepped up to the maximum allowed level (Vva_mx).

According to curve 1124, Vvb_lo is at Vvb_init during PV4 to PV6. These are one or more initial program-verify iterations for a set of B-state transistors. During PV6, Nlockout (FIG. 11B) for the B-state (curve 1114) transitions above Ns to trigger the step up in Vvb_lo in the following program-verify iterations, until Vvb_lo reaches Vvb_mx, at which time Vvb_lo is held at Vvb_mx for a remainder of the program-verify iterations for the B-state. In particular, Vvb_lo is stepped up in PV7 to PV10 in a range of voltages from Vvb_init to Vvb_mx (a range of ΔVvb), and kept at Vvb_mx in PV11. PV7 to PV10 are multiple program-verify iterations in which the lockout verify voltage is stepped up. The multiple program-verify iterations are concluded and the one or more final program-verify iterations (PV11) begin for the set of B-state transistors when the lockout verify voltage has been stepped up to the maximum allowed level (Vvb_mx).

According to curve 1126, Vvc_lo is at Vvc_init during PV7 to PV9. These are one or more initial program-verify iterations for a set of C-state transistors. During PV9, Nlockout (FIG. 11B) for the C-state (curve 1116) transitions above Ns to trigger the step up in Vvc_lo in the following program-verify iterations, until Vvc_lo reaches Vvc_mx, at which time Vvc_lo is held at Vvc_mx for a remainder of the program-verify iterations for the C-state. In particular, Vvc_lo is stepped up in PV10 to PV13 in a range of voltages from Vvc_init to Vvc_mx (a range of ΔVvc), and kept at Vvc_mx in PV14 and PV15. PV10 to PV13 are multiple program-verify iterations in which the lockout verify voltage is stepped up. The multiple program-verify iterations are concluded and the one or more final program-verify iterations (PV14 and PV15) begin for the set of C-state transistors when the lockout verify voltage has been stepped up to the maximum allowed level (Vvb_mx). In this example, ΔVva>ΔVvb>ΔVvc. Note that Ns could be different for the different data states.

As discussed, the A-state cells which reach the lockout status can experience a Vth upshift when one or both bit line adjacent memory cells continue to program. The target data states are typically randomly distributed among the memory cells so that there is a probability that a given locked out memory cell will have a bit line adjacent memory cell (in the A-state or another state) that is being programmed in a given program-verify iteration. For a given memory cell, the expected Vth upshift after it locks out is a function of the probability in each remaining program-verify iteration of the programming operation that a bit line adjacent memory cell is being programmed. Progressively smaller increases in the verify voltage can be optimal since the probability of program disturb is initially largest at lower program-verify iterations and becomes progressively smaller at higher program-verify iterations. Moreover, due to the normal shape of the Vth distribution, the mid-range transistors, having a speed between the fastest and slowest programming transistors, will lockout relatively soon after the fastest-programming transistors lockout. Thus, the probability of program disturb become smaller relatively soon and Vv_lo can step up relatively quickly, using progressively smaller steps, after the fastest-programming transistors lockout.

Referring again to FIG. 2A, consider an example in which memory cells 230, 212, and 216 are to remain in the erased state, memory cells 230, 212 and 216 are to be programmed to the A-state, memory cells 240, 213 and 217 are to be programmed to the B-state, and memory cells 250, 215 and 219 are to be programmed to the C-state. The A-state memory cells can be one set of transistors (e.g., transistors 230, 212 and 216) among a plurality of sets of transistors, where the one set of transistors is programmed to one target data state (the A-state) in the programming operation using a lockout verify voltage (Vva_lo). The plurality of sets of transistors comprises another set of transistors (e.g., transistors 240, 213 and 217) which are programmed to another target data state (B) using another lockout verify voltage (Vvb_lo), where the another target data state is higher than the one target data state, e.g., Vvb_mx>Vva_mx. The plurality of sets of transistors can comprise an additional set of transistors (e.g., transistors 250, 215 and 219) which are programmed to an additional target data state (C) using an additional lockout verify voltage (Vvc_lo). The additional target data state is higher than the another target data state, e.g., Vvc_mx>Vvb_mx.

Figure 12A:
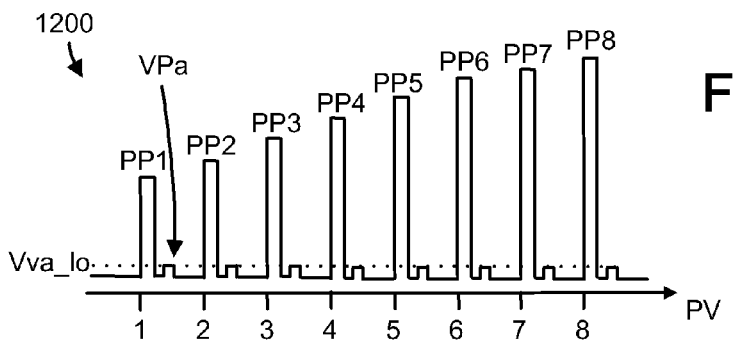
FIG. 12A depicts voltages used in the first pass of a two-pass programming operation such as depicted in FIGS. 5A to 5C.

FIG. 12A depicts voltages used in the first pass of a two-pass programming operation such as depicted in FIGS. 5A to 5C. The voltage waveform 1200 depicts a series of program pulses PP1 to PP8 and verify pulse that are applied to a word line selected for programming, and to an associated set of memory cells. One dynamic lockout verify level, Vva_lo, is provided after each program pulse. For example, an A-state verify pulse (e.g., VPa) at a level of Vva_lo may be applied after each of PP1 to PP8.

Figure 12B:
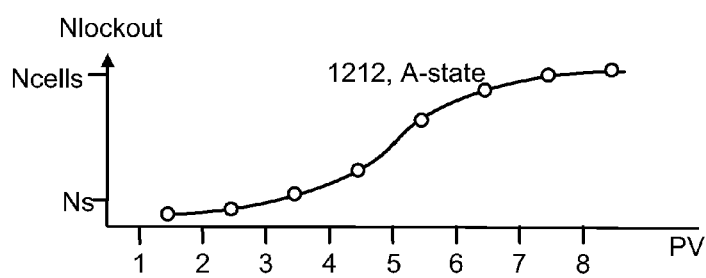
FIG. 12B depicts a number of memory cells which have a lockout status as a function of program-verify iteration in the first pass of the programming operation of FIG. 12A.

FIG. 12B depicts a number of memory cells which have a lockout status as a function of program-verify iteration in the first pass of the programming operation of FIG. 12A. Curve 1212 includes data points for the A-state memory cells. The y-axis depicts a number (Nlockout) of the memory cells which have the lockout status after the current program-verify iteration. Each circle represents a data point and is aligned with the corresponding verify pulse of the PV iteration. Nlockout is initially at zero and then transitions toward Ncells, the number of A-state memory cells being programmed.

Figure 12C:
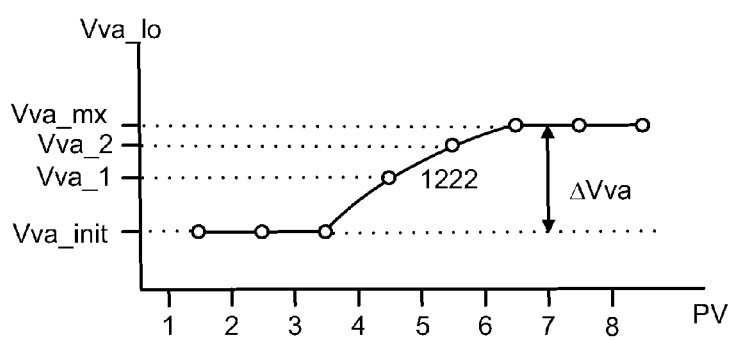
FIG. 12C depicts example dynamic verify voltages for A-state memory cells as a function of program-verify iteration in the first pass of the programming operation of FIG. 12A, for a case with progressively smaller increases in the verify voltage.

FIG. 12C depicts example dynamic verify voltages for A-state memory cells as a function of program-verify iteration in the first pass of the programming operation of FIG. 12A, for a case with progressively smaller increases in the verify voltage with each program-verify iteration. Curve 1222 includes data points which represent Vva_lo. Vva_lo is at Vva_init during PV1 to PV3. During PV3, Nlockout (FIG. 12B) for the A-state (curve 1212) transitions above Ns to trigger the step up in Vva_lo in the following program-verify iterations, until Vva_lo reaches Vva_mx, at which time Vva_lo is held at Vva_mx for a remainder of the program-verify iterations for the A-state. In particular, Vva_lo is stepped up in PV4 to PV6 in a range of voltages from Vva_init to Vva_mx (a range of ΔVva), and kept at Vva_mx in PV7 and PV8. This example provides progressively smaller increases in the verify voltage. For example, Vva_lo increases from Vva_init to Vva_1 in PV4, from Vva_1 to Vva_2 in PV5, and from Vva_2 to Vva_mx in PV6, where: (Vva_1−Vva_init)>(Vva_2−Vva_1)>(Vva_mx−Vva_2).

A further variation is to use a same stepped up level of the dynamic lockout verify level in at least two consecutive program-verify iterations. For example, Vva_lo can be stepped up and held at Vva__1 during PV4 and PV5, then stepped up to Vva__2 in PV6, and then stepped up to Vva_mx in PV7.

Figure 12D:
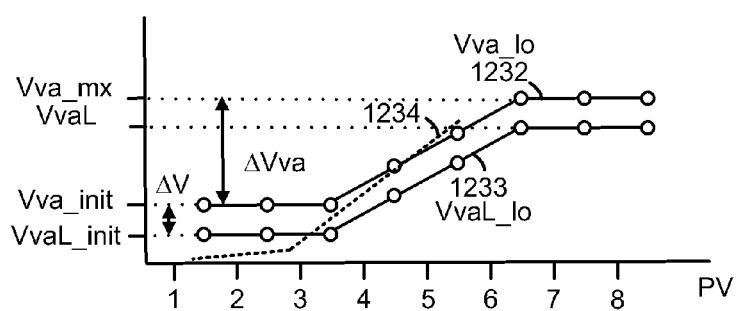
FIG. 12D depicts example dynamic verify voltages for A-state memory cells as a function of program-verify iteration in the first pass of the programming operation of FIG. 12A, for a case with a fixed step size for the verify voltage with each program-verify iteration, where slow and fast programming modes are used.

FIG. 12D depicts example dynamic verify voltages for A-state memory cells as a function of program-verify iteration in the first pass of the programming operation of FIG. 12A, for a case with a fixed step size for the verify voltage with each program-verify iteration, where slow and fast programming modes are used. The y-axis depicts a verify level for the A-state memory cells. Curve 1232 depicts Vva_lo, a dynamic lockout verify level, which increases from Vva_init to Vva_mx in fixed steps. Curve 1233 depicts VvaL_lo, a verify level for determining a transition from the fast programming mode to the slow programming mode, which increases from VvaL_init to VvaL_mx in fixed steps. In one approach, VvaL_lo is less than Vva_lo by a fixed margin ΔV. Curve 1234 depicts a Vth of an example A-state memory cell. In PV1 and PV2, Vth<VvaL_lo so that the memory cell is in the fast programming mode (e.g., with Vbl=0 V). In PV3, Vth>VvaL_lo so that the memory cell will be in the slow programming mode in subsequent PV iterations, with Vbl=0.8 V. In PV5, Vth>Vva_lo, so that the memory cell will be in the lockout state in the subsequent PV iterations, with Vbl=Vdd. Slow and fast programming modes can be provided for other data states similarly.

Figure 12E:
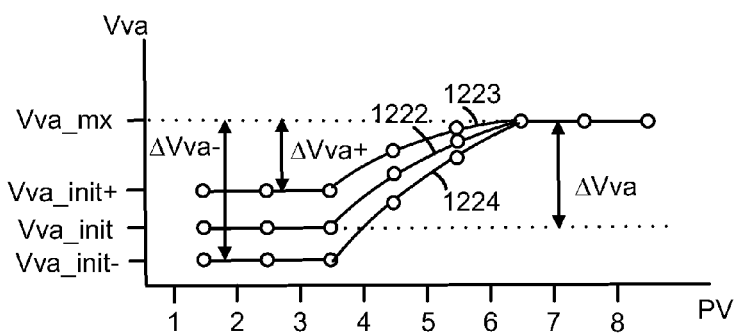
FIG. 12E depicts example dynamic verify voltages for A-state memory cells as a function of program-verify iteration in the first pass of the programming operation of FIG. 12A, where the initial verify level is a function of a natural Vth distribution width.

FIG. 12E depicts example dynamic verify voltages for A-state memory cells as a function of program-verify iteration in the first pass of the programming operation of FIG. 12A, where the initial verify level is a function of a natural Vth distribution width. When the width of the natural Vth distribution is relatively greater, there is a greater difference between the fastest and slowest programming memory cells. As a result, relatively more program-verify iterations are needed to program the memory cells, and the fastest programming memory cells will be subject to more program disturb. To compensate, the initial value of the verify level can be reduced so that the range of values of the lockout verify level is increased. For instance, for the A-state, the initial verify level can be reduced from a nominal level of Vva_init to a reduced level of Vva_init− so that the range of values of the lockout verify level increases from ΔVva to ΔVva− (curve 1224).

Similarly, when the width of the natural Vth distribution is relatively smaller, there is a smaller difference between the fastest and slowest programming memory cells. As a result, relatively fewer program-verify iterations are needed to program the memory cells, and the fastest programming memory cells will be subject to less program disturb. To compensate, the initial value of the verify level can be increased so that the range of values of the lockout verify level is decreased. For instance, for the A-state, the initial verify level can be increased from the nominal level of Vva_init to an increased level of Vva_init+ so that the range of values of the lockout verify level decreases from ΔVva to ΔVva+ (curve 1223).

Similar reasoning applies to programming of the select gate transistors such that the range of values of the lockout verify level can be increased or decreased when the width of the natural Vth distribution is relatively greater or smaller, respectively.

Figure 13A:
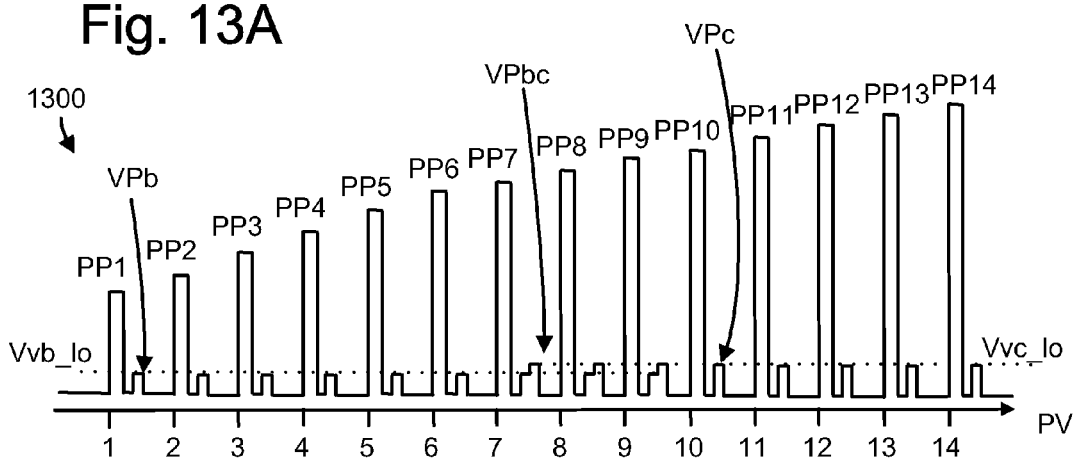
FIG. 13A depicts voltages used in the second pass of a two-pass programming operation such as depicted in FIGS. 5A to 5C.

FIG. 13A depicts voltages used in the second pass of a two-pass programming operation such as depicted in FIGS. 5A to 5C. The voltage waveform 1300 depicts a series of program pulses PP1 to PP14 and verify pulses that are applied to a word line selected for programming, and to an associated set of memory cells. A B-state verify pulse (e.g., VPb) at a level of Vvb_lo may be applied after each of PP1 to PP6. B- and C-state verify pulses (e.g., VPbc) at levels of Vvb_lo and Vvc_lo, respectively, may be applied after each of PP7 to PP9. C-state verify pulses (e.g., VPc) at a level of Vvc_lo may be applied after each of PP10 to PP14.

Figure 13B:
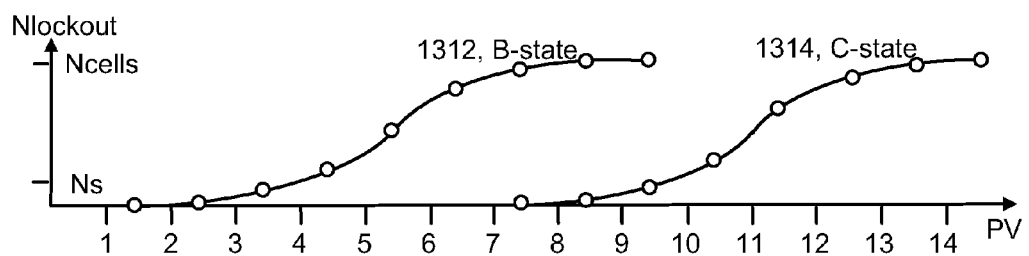
FIG. 13B depicts a number of memory cells which have a lockout status as a function of program-verify iteration in the second pass of the programming operation of FIG. 13A.

FIG. 13B depicts a number of memory cells which have a lockout status as a function of program-verify iteration in the second pass of the programming operation of FIG. 13A. The x-axis depicts the PV# and is aligned with FIG. 13A. The y-axis depicts a number (Nlockout) of the memory cells which have the lockout status after the current program-verify iteration. Each circle represents a data point and is aligned with the corresponding verify pulse of the PV iteration. Curve 1312 includes data points for the B-state memory cells. Curve 1314 includes data points for the C-state memory cells. Nprog is initially at zero and then transitions toward Ncells, the number of B-state memory cells being programmed and the number of C-state memory cells being programmed. Curve 1312 includes data points for the B-state memory cells. Curve 1314 includes data points for the C-state memory cells.

Figure 13C:
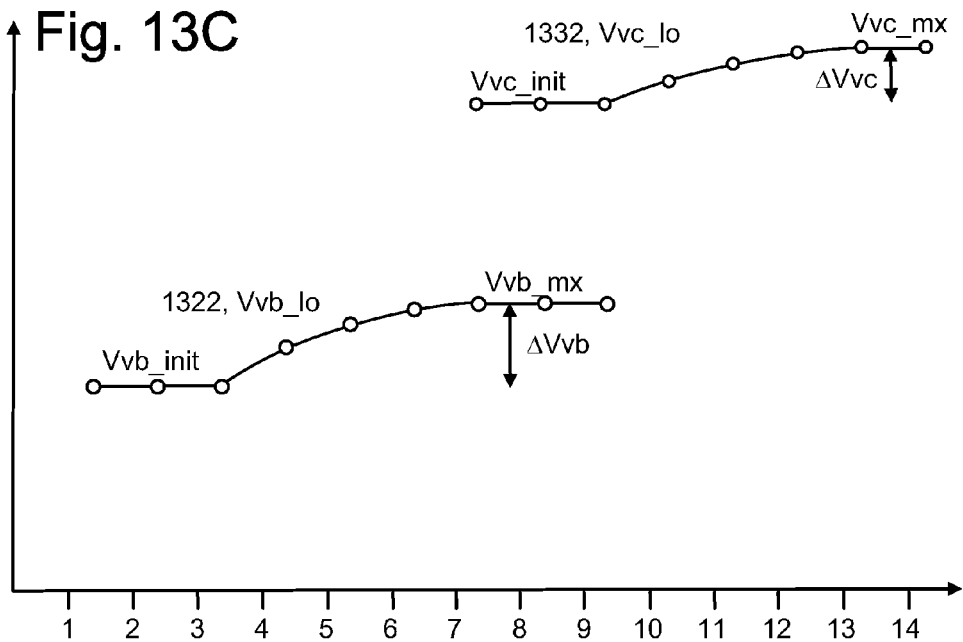
FIG. 13C depicts example dynamic verify voltages for B- and C-state memory cells as a function of program-verify iteration in the second pass of the programming operation of FIG. 13A, for a case with progressively smaller increases in the verify voltage.

FIG. 13C depicts example dynamic verify voltages for B- and C-state memory cells as a function of program-verify iteration in the second pass of the programming operation of FIG. 13A, for a case with progressively smaller increases in the verify voltage. Curves 1322 and 1332 include data points which represent Vvb_lo and Vvc_lo for the B- and C-state memory cells, respectively. According to curve 1322, Vvb_lo is at Vvb_init during PV1 to PV3. During PV3, Nlockout (FIG. 13B) for the B-state (curve 1312) transitions above Ns to trigger the step up in Vvb_lo in the following program-verify iterations, until Vvb_lo reaches Vvb_mx, at which time Vvb_lo is held at Vvb_mx for a remainder of the program-verify iterations for the B-state. In particular, Vvb_lo is stepped up in PV4 to PV7 in a range of voltages from Vvb_init to Vvb_mx (a range of ΔVvb), and kept at Vvb_mx in PV8 and PV9.

According to curve 1332, Vvc_lo is at Vvc_init during PV7 to PV9. During PV9, Nlockout (FIG. 13B) for the C-state (curve 1314) transitions above Ns to trigger the step up in Vvc_lo in the following program-verify iterations, until Vvc_lo reaches Vvc_mx, at which time Vvc_lo is held at Vvc_mx for a remainder of the program-verify iterations for the C-state. In particular, Vvc_lo is stepped up in PV10 to PV13 in a range of voltages from Vvc_init to Vvc_mx (a range of ΔVvc), and kept at Vvc_mx in PV14.

Figure 14A:
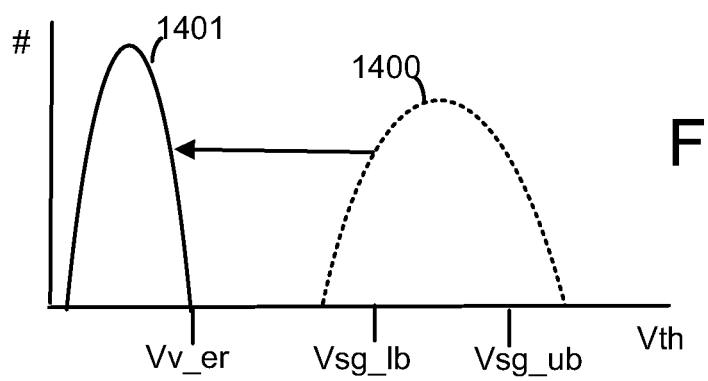
FIG. 14A depicts a change in the Vth distribution of a set of select gate transistors during an erase operation.

FIG. 14A depicts a change in the Vth distribution of a set of select gate transistors during an erase operation. As mentioned, the Vth of a select gate transistor should be within a range depicted as Vsg_lb (lower boundary) to Vsg_ub (upper boundary). Proper operation of the memory device depends on the SGD transistors, in particular. For programming of memory cells, a limiting condition is the slow programming mode, where Vsgd>Vsg_ub+0.8 V for an SGD transistor to be in a conductive state to allow programming. Vbl=0.8 V in this example. Another limiting condition is for inhibited memory cells, where Vsgd<2.5 V+Vsg_lb. Vbl=2.5 V in this example. To satisfy both conditions, the Vsgd window is 2.5-0.8-(Vsg_ub-Vsg_lb). If we further allow 0.4 V as a margin between the on and off voltages of the SG transistor, the Vsgd window is 1.3 V-(Vsg_ub-Vsg_lb). Accordingly, the usable Vsgd window is heavily dependent on Vsg_ub-Vsg_lb, the Vth distribution of the SG transistors, such that controlling the Vth distribution is important.

However, the Vth can stray from this range over time. For example, in a read or programming operation, if the Vth of an SGD transistor is too low in an unselected NAND string (such as in an unselected block), the associated NAND string cannot be cutoff from the bit line using Vsgd=0 V. Also, during a programming operation, if the Vth of an SGD transistor is too high, the associated NAND string to be programmed cannot be connected to the bit line.

In the BiCS structure, due to lack of channel and cell source/drain implant, it is difficult to control the Vth of the SG transistors. Moreover, the Vth can vary for different SGD transistors due to normal process variations. The Vth of different SGD transistors typically has a distribution about a median value. To maximize the Vsgd window, the Vth distribution should be a narrow as possible. The Vth can be adjusted by process variations during fabrication, e.g., variations in physical dimensions such as recess step, body thickness and radius, and variations in drain implantation/doping. However, the effectiveness of such process variations is limited and they are difficult and expensive to control. Moreover, the Vth distribution can vary over time as additional program-erase cycles are experienced by the memory device.

Erasing followed by programming can return the Vth to the acceptable range. In an erase operation, the Vth is decreased from a distribution 1400 to a distribution 1401 using an erase verify level of Vv_er. This provides the Vth of the transistors at a known level. Subsequently, as depicted in FIG. 14B, the transistors can be programmed.

Due to the charge-trapping layer of the SG transistors, e.g., in the BiCS structure and in the flat cell 2D NAND structure, programming and erasing can occur. If the SG transistors are programmed, controlling the final Vth distribution is important since it determines the Vsgd window (the range of acceptable values for Vsgd) during programming and allows successful programming and inhibiting of the memory cells.

Figure 14B:
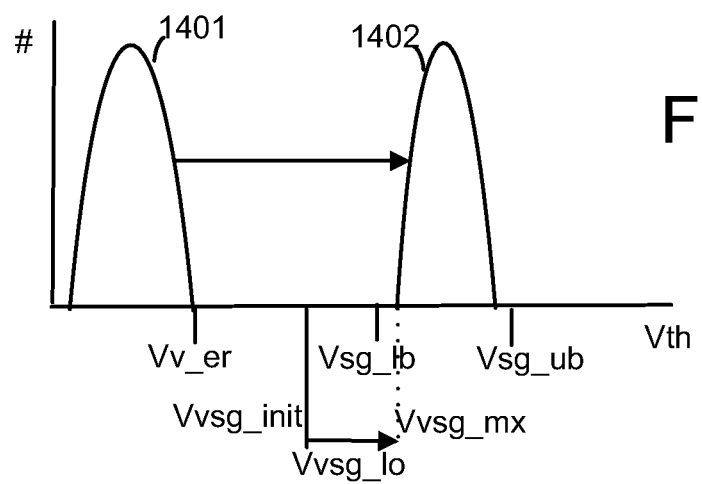
FIG. 14B depicts a change in the Vth distribution of a set of select gate transistors during a programming operation, where a dynamic verify level is used.

FIG. 14B depicts a change in the Vth distribution of a set of select gate transistors during a programming operation, where a dynamic verify level is used. The Vth is increased from the distribution 1401 to a distribution 1402 using a lockout program verify level of Vvsg_lo which dynamically increases from a fixed initial level of Vvsg_init to a fixed, final, maximum level Vvsg_mx. Vvsg_mx can be slightly greater than Vsg_lb to provide a margin. Similar to the situation in FIGS. 8A to 8K, depicting programming of memory cells, the faster-programming select gate transistors will reach a lockout status before the slower-programming select gate transistors, and program disturb will increase the Vth of the faster-programming select gate transistors to a common level with the slower-programming select gate transistors at the completion of the programming operation, to achieve the narrow Vth distribution 1402. Further details of erasing and programming select gate transistors are provided next.

Figure 15A:
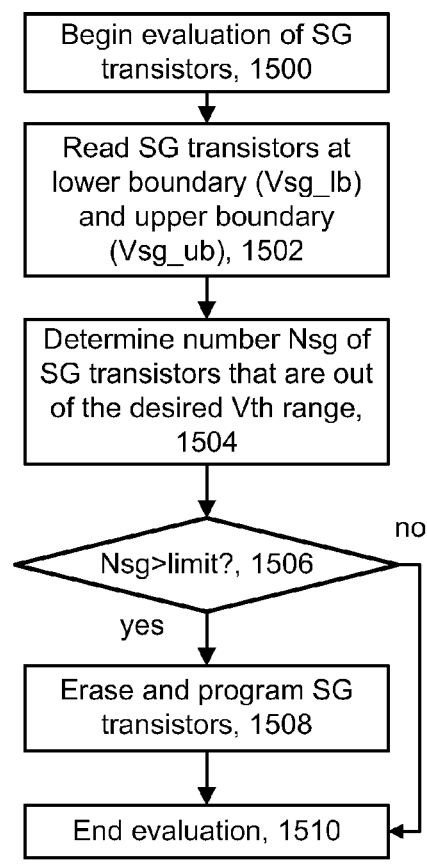
FIG. 15A depicts a flowchart of a process for evaluating a select gate transistors.

FIG. 15A depicts a flowchart of a process for evaluating a select gate transistors. Step 1500 begins the evaluation of the SG transistors. The evaluation can be triggered by various criterion, such as passage of a number of program-erase cycles or detection of a high number of programming errors. The evaluation can be performed before every nth programming operation, where n≥1. At step 1502, the SG transistors are read at the lower boundary (Vsg_lb) and the upper boundary (Vsg_ub). Step 1504 determines a number Nsg of the SG transistors that are out of the desired range. Decision step 1506 determines if Nsg>limit, where limit≥1. If decision step 1506 is true, step 1508 is performed to erase and then program the SG transistors (see FIGS. 15B and 9B, respectively). In one approach, a set of SG transistors are erased and programmed together. If decision step 1506 is false, step 1510 ends the evaluation.

Figure 15B:
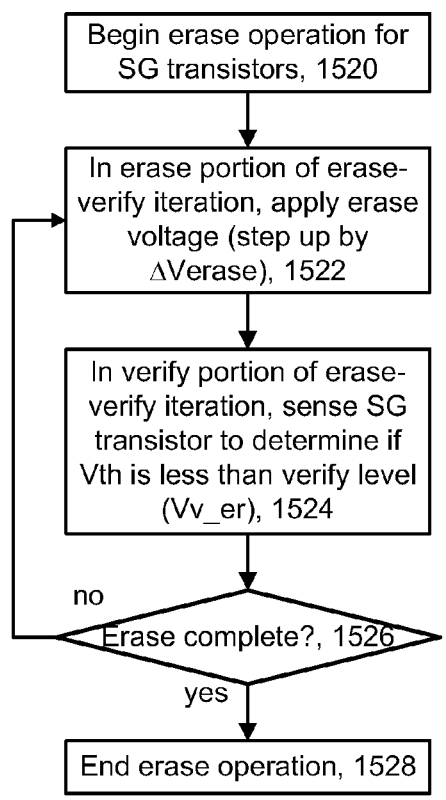
FIG. 15B depicts a flowchart of a process for erasing select gate transistors in accordance with step 1508 of FIG. 15A.

FIG. 15B depicts a flowchart of a process for erasing select gate transistors in accordance with step 1508 of FIG. 15A. Step 1520 begins the erase operation for the SG transistors. At step 1522, an erase voltage (e.g., Vbl) is applied to the SG transistors in the erase portion of an erase-verify iteration (see FIG. 16A). The erase voltage can be stepped up in each erase-verify iteration by ΔVerase. At step 1524, the SG transistors are sensed to determine if their Vth is less than the verify level (Vv_er) in the verify portion of the erase-verify iteration (see FIG. 16B). Decision step 1526 determines if the erase operation is complete. If decision step 1526 is true (e.g., all or almost all of the SG transistors have a Vth<Vv_er), the erase operation ends at step 1528. If decision step 1526 is false, the erase portion of the next erase-verify iteration begins at step 1522.

The programming operation for the SG transistors can proceed as discussed in connection with FIG. 9B. Regarding step 928 of FIG. 9B and the program voltage, see FIG. 16C. Regarding step 930 of FIG. 9B and the verify voltage, see FIG. 16E.

FIG. 16A depicts erase voltages used in the erasing process of FIG. 15B. The x-axis depicts a number of erase-verify (EV) iterations and the y-axis depicts Vbl. A voltage waveform 1000 includes erase pulses EP1 to EP5, for instance. One implementation of an erase operation uses the SGD transistors to generate a gate-induced drain leakage (GIDL) current to charge up the floating body of the NAND string while the SGD control gate voltage, Vsgd, floats. In this case, the erase voltages are applied to the drain terminals of the SG transistors via the bit lines. GIDL increases in proportion to the drain-to-gate voltage (Vdg) of the SGD transistors. Vsgd is then driven down sharply to a low level such as 0 V to create an electric field across the tunnel oxide which causes holes to be injected from the SG transistor's body to the charge-trapping layer, resulting in a large Vth downshift toward the erase-verify level, Vv_er. This process can be repeated in successive iterations until the verify test is passed. Memory cell transistors can also be erased in a similar manner.

FIG. 16B depicts verify voltages used in the erasing process of FIG. 15B. The x-axis depicts the number of erase-verify (EV) iterations, consistent with FIG. 16A, and the y-axis depicts Vsgd. The waveform depicts a series of erase-verify pulses EVP1 to EVP at a level of Vv_er in the erase operation.

FIG. 16C depicts program voltages used in a programming operation for SG transistors in accordance with step 1508 of FIG. 15A. The x-axis depicts a number of program-verify (PVsg) iterations and the y-axis depicts Vsgd. An example waveform 1050 includes a series of program pulses PPsg1 to PPsg7.

FIG. 16D depicts a number of SG transistors which have a lockout status as a function of program-verify iteration in the programming operation of FIG. 16C. The number of locked out transistors (Nlockout) is initially zero, then increases above a threshold level, Ns, which triggers a step up in Vvsg_lo in the following program-verify iterations. The number of locked out transistors eventually approaches Ntran, the number of SG transistors being programmed.

FIG. 16E depicts dynamic verify voltages used in the programming operation of FIG. 16C. The x-axis depicts the number of erase-verify (EV) iterations, consistent with FIGS. 16C and 16D, and the y-axis depicts the lockout verify voltage for the SG transistors, Vvsg_lo. The dynamic verify voltages are VPsg1 to VPsg7 and range from an initial level of Vvsg_init to a final value of Vvsg_mx, in a range of ΔVvsg.

Accordingly, it can be seen that, in one embodiment, a method is provided for programming transistors in a memory device. The method comprises performing each program-verify iteration of a plurality of program-verify iterations, the plurality of program-verify iterations comprise program-verify iterations for a set of transistors which are to be programmed in a programming operation, each transistor initially has a program status which indicates that the transistor is to be programmed, the performing each program-verify iteration comprises applying a program pulse to the set of transistors, determining whether a threshold voltage of at least some of the transistors with the program status exceeds a lockout verify voltage and changing the program status to a lockout status for a remainder of the programming operation for each of the transistors for which the threshold voltage is determined to exceed the lockout verify voltage, the lockout verify voltage is stepped up in multiple program-verify iterations of the program-verify iterations for the set of transistors.

In another embodiment, a non-volatile storage system comprises a set of transistors which are to be programmed in a programming operation, and a control circuit. The control circuit: performs each program-verify iteration of a plurality of program-verify iterations of the programming operation, the plurality of program-verify iterations comprises program-verify iteration for the set of transistors, each transistor initially has a program status which indicates that the transistor is to be programmed, each program-verify iteration involves application of a program pulse to the set of transistors, a determination of whether a threshold voltage of at least some of the transistors with the program status exceeds a lockout verify voltage and a change of the program status to a lockout status for a remainder of the programming operation for each of the transistors for which the threshold voltage is determined to exceed the lockout verify voltage, the lockout verify voltage is stepped up in multiple program-verify iterations of the program-verify iterations for the set of transistors.

In another embodiment, a method for programming memory cells in a memory device comprises: performing each program-verify iteration of a plurality of program-verify iterations, the plurality of program-verify iterations comprise program-verify iterations for one set of memory cells which are to be programmed to one target data state using a lockout verify voltage of the one target data state in a programming operation, and program-verify iterations for another set of memory cells which are to be programmed to another target data state using a lockout verify voltage of the another target data state in the programming operation, each memory cell in the one set of memory cells and the another set of memory cells initially has a program status which indicates that the memory cell is to be programmed. The performing each program-verify iteration comprises: applying a program pulse to the one set of memory cells and the another set of memory cells; determining whether a threshold voltage of at least some of the memory cells in the one set of memory cells with the program status exceeds the lockout verify voltage of the one target data state and changing the program status to a lockout status for a remainder of the programming operation for each of the memory cells in the one set of memory cells for which the threshold voltage is determined to exceed the lockout verify voltage of the one target data state; and determining whether a threshold voltage of at least some of the memory cells in the another set of memory cells with the program status exceeds the lockout verify voltage of the another target data state and changing the program status to the lockout status for a remainder of the programming operation for each of the memory cells in the another set of memory cells for which the threshold voltage is determined to exceed the lockout verify voltage of the another target data state, the lockout verify voltage of the one target data state is stepped up in the program-verify iterations for the one set of memory cells at a different rate than a rate at which the lockout verify voltage of the another target data state is stepped up in the program-verify iterations for the another set of memory cells.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming transistors, comprising:
performing each program-verify iteration of a plurality of program-verify iterations for a set of transistors which are to be programmed in a programming operation, the set of transistors is in a memory device, the memory device comprises a plurality of memory cells formed above a substrate in multiple physical levels of memory cells in a three-dimensional non-volatile memory, the plurality of memory cells comprise columnar active areas, each transistor initially has a program status which indicates that the transistor is to be programmed, and the performing each program-verify iteration comprises applying a program pulse to the set of transistors, determining whether a threshold voltage of at least some of the transistors with the program status exceeds a lockout verify voltage and changing the program status to a lockout status for a remainder of the programming operation for each of the transistors for which the threshold voltage is determined to exceed the lockout verify voltage, the lockout verify voltage is stepped up in multiple program-verify iterations of the program-verify iterations for the set of transistors.

2. The method of claim 1, wherein:
the lockout verify voltage is at a fixed initial level in a plurality of initial program-verify iterations of the program-verify iterations for the set of transistors, the plurality of initial program-verify iterations are before the multiple program-verify iterations.

3. The method of claim 2, further comprising:
beginning the multiple program-verify iterations at a predetermined program-verify iteration of the programming operation, after the plurality of initial program-verify iterations.

4. The method of claim 2, further comprising:
adaptively determining during the programming operation, based on a programming progress of the set of transistors, when to begin the multiple program-verify iterations.

5. The method of claim 2, further comprising:
determining a natural threshold voltage distribution of the set of transistors; and
setting the fixed initial level to be relatively lower when the natural threshold voltage distribution is relatively wider and relatively higher when the natural threshold voltage distribution is relatively narrower.

6. The method of claim 1, further comprising:
concluding the multiple program-verify iterations and beginning one or more final program-verify iterations of the program-verify iterations for the set of transistors when the lockout verify voltage has been stepped up to a maximum allowed level, the lockout verify voltage is at the maximum allowed level in the one or more final program-verify iterations.

7. The method of claim 1, wherein:
the multiple program-verify iterations are consecutive program-verify iterations.

8. The method of claim 1, further comprising:
during the program pulse of each program-verify iteration of the program-verify iterations for the set of transistors, setting a respective drain voltage at a lockout level for transistors having the lockout status and setting a respective drain voltage at a program level for transistors having the program status.

9. The method of claim 1, wherein:
for at least some of the transistors, a threshold voltage increases after changing the program status to the lockout status, bringing threshold voltages of faster-programming transistors of the set of transistors closer to threshold voltages of slower-programming transistors of the set of transistors.

10. The method of claim 1, wherein:
the set of transistors comprises a set of charge-trapping select gate transistors.

11. The method of claim 1, wherein:
the set of transistors comprises a set of memory cell transistors.

12. The method of claim 11, wherein:
the set of memory cell transistors is one set of memory cell transistors among a plurality of sets of memory cell transistors;
the one set of memory cell transistors is programmed to one target data state in the programming operation;
the lockout verify voltage is for the one target data state;
the plurality of sets of memory cell transistors comprises another set of memory cell transistors which are programmed to another target data state in the programming operation using another lockout verify voltage which is stepped up in multiple program-verify iterations of the plurality of program-verify iterations, the another target data state is higher than the one target data state; and
the another lockout verify voltage is stepped up in a range of voltages which is less than a range of voltages in which the lockout verify voltage for the one target data state is stepped up.

13. The method of claim 12, wherein:
the plurality of sets of memory cell transistors comprises an additional set of memory cell transistors which are programmed to an additional target data state in the programming operation using an additional lockout verify voltage which is stepped up in multiple program-verify iterations of the plurality of program-verify iterations; and
a range of voltages in which the additional lockout verify voltage is stepped up is less than the range of voltages in which the another lockout verify voltage is stepped up.

14. The method of claim 1, wherein:
the lockout verify voltage in each of the multiple program-verify iterations is stepped up using a fixed step size.

15. The method of claim 1, wherein:
the lockout verify voltage is stepped up in each of the multiple program-verify iterations by progressively smaller step sizes.

16. The method of claim 1, wherein:
the performing each program-verify iteration is performed by circuitry which is associated with operation of the set of transistors and the circuitry is within the substrate.

17. The method of claim 1, wherein:
the performing each program-verify iteration is performed by circuitry which is associated with operation of the set of transistors and the circuitry is above the substrate.

18. A non-volatile storage system, comprising:
a substrate;
a set of transistors which are to be programmed in a programming operation, the set of transistors is in a memory device, the memory device comprises a plurality of memory cells formed above a substrate in multiple physical levels of memory cells in a three-dimensional non-volatile memory, the plurality of memory cells comprise columnar active areas; and
circuitry coupled with the set of transistors, the circuitry:
performs each program-verify iteration of a plurality of program-verify iterations of the programming operation for the set of transistors, each transistor initially has a program status which indicates that the transistor is to be programmed, each program-verify iteration involves application of a program pulse to the set of transistors, a determination of whether a threshold voltage of at least some of the transistors with the program status exceeds a lockout verify voltage and a change of the program status to a lockout status for a remainder of the programming operation for each of the transistors for which the threshold voltage is determined to exceed the lockout verify voltage, the lockout verify voltage is stepped up in multiple program-verify iterations of the program-verify iterations for the set of transistors.

19. The non-volatile storage system of claim 18, wherein:
the lockout verify voltage is at a fixed initial level in a plurality of initial program-verify iterations of the program-verify iterations for the set of transistors, and the plurality of initial program-verify iterations are before the multiple program-verify iterations.

20. The non-volatile storage system of claim 18, wherein:
the circuitry concludes the multiple program-verify iterations and begins one or more final program-verify iterations of the program-verify iterations for the set of transistors when the lockout verify voltage has been stepped up to a maximum allowed level, and the lockout verify voltage is the maximum allowed level in the one or more final program-verify iterations.

21. The non-volatile storage system of claim 18, wherein:
the set of transistors comprises a set of charge-trapping select gate transistors.

22. The non-volatile storage system of claim 18, wherein:
the set of transistors comprises a set of memory cell transistors.

23. The non-volatile storage system of claim 18, wherein:
the circuitry is within the substrate.

24. The non-volatile storage system of claim 18, wherein:
the circuitry is above the substrate.

25. A method for programming memory cells, comprising:
performing each program-verify iteration of a plurality of program-verify iterations, the plurality of program-verify iterations comprise program-verify iterations for one set of memory cells which are to be programmed to one target data state using a lockout verify voltage of the one target data state in a programming operation, and program-verify iterations for another set of memory cells which are to be programmed to another target data state using a lockout verify voltage of the another target data state in the programming operation, each memory cell in the one set of memory cells and the another set of memory cells initially has a program status which indicates that the memory cell is to be programmed, the one set of memory cells and the another set of memory cells comprise columnar active areas and are formed above a substrate in multiple physical levels of memory cells in a three-dimensional non-volatile memory, the performing each program-verify iteration comprises:
applying a program pulse to the one set of memory cells and the another set of memory cells;
determining whether a threshold voltage of at least some of the memory cells in the one set of memory cells with the program status exceeds the lockout verify voltage of the one target data state and changing the program status to a lockout status for a remainder of the programming operation for each of the memory cells in the one set of memory cells for which the threshold voltage is determined to exceed the lockout verify voltage of the one target data state; and
determining whether a threshold voltage of at least some of the memory cells in the another set of memory cells with the program status exceeds the lockout verify voltage of the another target data state and changing the program status to the lockout status for a remainder of the programming operation for each of the memory cells in the another set of memory cells for which the threshold voltage is determined to exceed the lockout verify voltage of the another target data state, the lockout verify voltage of the one target data state is stepped up in the program-verify iterations for the one set of memory cells at a different rate than a rate at which the lockout verify voltage of the another target data state is stepped up in the program-verify iterations for the another set of memory cells.

26. The method of claim 25, wherein:
the lockout verify voltage of the one target data state is stepped up in the program-verify iterations for the one set of memory cells by progressively smaller step sizes.

27. The method of claim 25, wherein:
the plurality of program-verify iterations comprise program-verify iterations for an additional set of memory cells which are to be programmed to an additional target data state using a lockout verify voltage of the additional target data state in the programming operation;
each memory cell in the additional set of memory cells initially has the program status; and
the performing each program-verify iteration comprises:
applying the program pulse to the additional set of memory cells; and
determining whether a threshold voltage of at least some of the memory cells in the additional set of memory cells with the program status exceeds the lockout verify voltage of the additional target data state and changing the program status to the lockout status for a remainder of the programming operation for each of the memory cells in the additional set of memory cells for which the threshold voltage is determined to exceed the lockout verify voltage of the additional target data state.

28. The method of claim 27, wherein:
the lockout verify voltage of the another target data state is stepped up in a range of voltages which is greater than a range of voltages in which the lockout verify voltage for the one target data state is stepped up.

29. The method of claim 25, wherein:
the performing each program-verify iteration is performed by circuitry which is associated with operation of the one set of memory cells and the another set of memory cells and the circuitry is within the substrate.

30. The method of claim 25, wherein:
the performing each program-verify iteration is performed by circuitry which is associated with operation of the one set of memory cells and the another set of memory cells and the circuitry is above the substrate.

* * * * *